US010347541B1

(12) United States Patent
Shu et al.

(10) Patent No.: US 10,347,541 B1
(45) Date of Patent: Jul. 9, 2019

(54) ACTIVE GATE CONTACTS AND METHOD OF FABRICATION THEREOF

(71) Applicant: GLOBALFOUNDRIES Inc., Grand Cayman (KY)

(72) Inventors: Jiehui Shu, Clifton Park, NY (US); David Paul Brunco, Latham, NY (US); Pei Liu, Clifton Park, NY (US); Shariq Siddiqui, Delmar, NY (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/962,808

(22) Filed: Apr. 25, 2018

(51) Int. Cl.
*H01L 27/088* (2006.01)
*H01L 21/8234* (2006.01)
(Continued)

(52) U.S. Cl.
CPC .......... *H01L 21/823475* (2013.01); *H01L 21/823431* (2013.01); *H01L 21/823481* (2013.01); *H01L 27/0886* (2013.01); *H01L 29/0649* (2013.01); *H01L 29/0847* (2013.01); *H01L 29/66545* (2013.01)

(58) Field of Classification Search
USPC ....... 257/401, 223, 227, 291, 292, 439, 443, 257/655, E27.112, E29.117, E29.145, 257/E29.147, E29.151, E29.182, E29.202, 257/E29.273–E29.299, E21.091, E21.104, 257/E21.21, E21.372, E21.411–E21.416, 257/E21.416–E21.422, 135–136, 242, 257/329, E27.091, E21.095–E27.096, 257/E29.118, E29.274, E29.313, E29.318, 257/E29.262, E21.41, E21.629, E21.643; 438/149, 163, 136, 137, 173, 192, 206, 438/212, 156
See application file for complete search history.

(56) References Cited

U.S. PATENT DOCUMENTS 6,072,221 A  6/2000 Hieda
6,855,610 B2  2/2005 Tung et al.
(Continued)

OTHER PUBLICATIONS

Auth et al., "A 10nm high performance and low-power CMOS technology featuring 3rd generation FinFET transistors, Self-Aligned Quad Patterning, contact over active gate and cobalt local interconnects", published in Conference: 2017 IEEE International Electron Devices Meeting (IEDM), 4 pages.

*Primary Examiner* — Niki H Nguyen
(74) *Attorney, Agent, or Firm* — Ditthavong & Steiner P.C.

(57) ABSTRACT

A method of forming contacts over active gates is provided. Embodiments include forming first and second gate structures over a portion of a fin; forming a first and second RSD in a portion of the fin between the first gate structures and between the first and the second gate structure, respectively; forming TS structures over the first and second RSD; forming a first cap layer over the first and second gate structures or over the TS structures; forming a metal oxide liner over the substrate, trenches formed; filling the trenches with a second cap layer; forming an ILD layer over the substrate; forming a CA through a first portion of the ILD and metal oxide layer down to the TS structures over the second RSD; and forming a CB through a second portion of the ILD and metal oxide layer down to the first gate structures.

20 Claims, 24 Drawing Sheets

(51) Int. Cl.
*H01L 29/06* (2006.01)
*H01L 29/66* (2006.01)
*H01L 29/08* (2006.01)

(56) References Cited

U.S. PATENT DOCUMENTS 6,884,715 B1 4/2005 Kwon et al.
2018/0358293 A1* 12/2018 Hong ................ H01L 21/32137

* cited by examiner

ACTIVE GATE CONTACTS AND METHOD OF FABRICATION THEREOF

TECHNICAL FIELD

The present disclosure relates to the manufacture of semiconductor devices, such as integrated circuits (ICs). The present disclosure is particularly applicable to forming contacts over active gates (COAG) of ICs in the 7 nanometer (nm) technology node and beyond.

BACKGROUND

There is an ever increasing demand for smaller semiconductor devices with increased memory, computational power, and speed. The continuous scaling down dimensions of semiconductor devices increases density. However, the conventional fabrication techniques involve contacting a portion of a gate electrode over an isolation region, which wastes layout space and adversely affects density. Therefore, forming contacts directly over the functional portion of the gate improves device density.

A need therefore exists for scaled down devices with COAG for efficient enabling methodology.

SUMMARY

An aspect of the present disclosure is a scaled down semiconductor device with COAG of forming source/drain contact (CA) and gate contact (CB).

Another aspect of the present disclosure is a method of fabricating scaled down semiconductor device with COAG.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first gate structures over a fin of a substrate and second gate structures, each over an outer portion of the fin and a shallow trench isolation (STI) layer adjacent to the fin; forming a first raised source/drain (RSD) in a portion of the fin between the first gate structures and a second RSD in the portion of the fin between the first gate structures and the second gate structures; forming trench silicide (TS) structures over the first RSD and each of the second RSD; forming a first cap layer over the first gate structures and the second gate structures or over the TS structures; conformally forming a metal oxide liner over the substrate, a plurality of trenches formed; filling the plurality of trenches with a second cap layer; forming an interlayer dielectric (ILD) layer over the substrate; forming a CA through a first portion of the ILD layer and the metal oxide layer down to the TS structures over the second RSD; and forming a CB through a second portion of the ILD layer and the metal oxide layer down to the first gate structures.

Aspects of the present disclosure include forming the first gate structures and the second gate structures by: forming first dummy gates, laterally separated, over the fin of the substrate and second dummy gates, laterally separated, each over the outer portion of the fin and the STI layer adjacent to the fin; forming a sidewall spacer on each sidewall of the first dummy gates and the second dummy gates; forming a second ILD layer over the substrate subsequent to the forming of the first RSD and the second RSD; planarizing the second ILD layer down to the sidewall spacers; removing the first dummy gates and the second dummy gates; forming a high-k/metal gate (HKMG) layer between the sidewall spacers and along a portion of the sidewall spacers; and forming a metal layer over the HKMG layer between the sidewall spacers and along a second portion of the sidewall spacers or along a remaining portion of the sidewall spacers. Further aspects include forming the TS structures by: removing the second ILD layer between the sidewall spacers over the first RSD and the second RSD, first trenches and second trenches formed, respectively; filling the first trench and the second trenches with cobalt (Co), tungsten (W), or ruthenium (Ru); and planarizing the Co, W, or Ru down to the sidewall spacers. Another aspect includes the metal layer formed along the second portion of the sidewall spacers, the method including: forming the first cap layer over the substrate; and planarizing the first cap layer down to the sidewall spacers.

Additional aspects include recessing the TS structures and adjacent sidewall spacers prior to forming the metal oxide layer. Further aspects include forming the CA through the second cap layer over the second RSD; and forming the CB through the first cap layer over the first gate structures and the second cap layer between the first gate structures. Another aspect includes the metal layer formed along a remaining portion of the sidewall spacers, the method including: recessing the TS structures; forming the first cap layer over the substrate; and planarizing the first cap layer down to the metal layer. Additional aspects include recessing the metal layer and adjacent sidewall spacers prior to forming the metal oxide layer. Further aspects include forming the CA through the first cap layer over the second RSD; and forming the CB through the second cap layer over the first gate structures. Another aspect includes forming the metal oxide liner of aluminum oxide ($Al_2O_3$), titanium dioxide ($TiO_2$) or hafnium oxide ($HfO_2$) by atomic layer deposition (ALD).

Another aspect of the present disclosure is a device including first gate structures over a fin of a substrate and second gate structures, each over an outer portion of the fin and a STI layer adjacent to the fin; a first RSD in a portion of the fin between the first gate structures and a second RSD in the portion of the fin between the first gate structures and the second gate structures; TS structures over the first RSD and each of the second RSD; a first cap layer over the first gate structures and the second gate structures or over the TS structures; a metal oxide liner over the substrate, a plurality of trenches formed; the plurality of trenches filled with a second cap layer; an ILD layer over the substrate; a CA through a first portion of the ILD layer and the metal oxide layer down to the TS structures over the second RSD; and a CB through a second portion of the ILD layer and the metal oxide layer down to the first gate structures.

Aspects of the device include the first gate structures and the second gate structures which include: a HKMG layer between sidewall spacers and along a portion of the sidewall spacers; and a metal layer over the HKMG layer between the sidewall spacers and along a second portion of the sidewall spacers or along a remaining portion of the sidewall spacers. Another aspect includes the CA through the second cap layer over the second RSD; and the CB through the first cap layer over the first gate structures and the second cap layer between the first gate structures. Other aspects include the CA through the first cap layer over the second RSD; and the CB through the second cap layer over the first gate structures. A further aspect includes the TS structures which include Co, W, or Ru. Additional aspects include the TS structures are formed to a thickness of 50 nm to 200 nm. Another aspect includes the metal oxide liner is formed to a thickness of 2 nm to 10 nm.

Aspects of the present disclosure include forming first gate structures over a fin of a substrate and second gate structures, each over an outer portion of the fin and a STI layer adjacent to the fin; forming a first RSD in a portion of the fin between the first gate structures and a second RSD in the portion of the fin between the first gate structures and the second gate structures; forming TS structures of Co, W, or Ru over the first RSD and each of the second RSD; forming a first cap layer of silicon nitride (SiN), silicon carbonitride (SiCN), silicon oxycarbonitride (SiOCN) or silicon oxycarbide (SiOC) over the first gate structures and the second gate structures or over the TS structures; conformally forming a metal oxide liner of $Al_2O_3$, $TiO_2$ or $HfO_2$ by ALD over the substrate, a plurality of trenches formed; filling the plurality of trenches with a second cap layer including $SiO_2$, SiOC or SiN; forming an ILD layer of silicon dioxide ($SiO_2$), SiOC or SiN over the substrate; forming a CA through a first portion of the ILD layer and the metal oxide layer down to the TS structures over the second RSD; and forming a CB through a second portion of the ILD layer and the metal oxide layer down to the first gate structures.

Another aspect includes forming the first gate structures and the second gate structures by: forming first dummy gates, laterally separated, over the fin of the substrate and second dummy gates, laterally separated, each over the outer portion of the fin and the STI layer adjacent to the fin; forming a sidewall spacer on each sidewall of the first dummy gates and the second dummy gates; forming a second ILD layer over the substrate subsequent to the forming of the first RSD and the second RSD; planarizing the second ILD layer down to the sidewall spacers; removing the first dummy gates and the second dummy gates; forming a HKMG layer between the sidewall spacers and along a portion of the sidewall spacers; and forming a metal layer over the HKMG layer between the sidewall spacers and along a second portion of the sidewall spacers or along a remaining portion of the sidewall spacers. A further aspect includes forming the TS structures by: removing the second ILD layer between the sidewall spacers over the first RSD and the second RSD, first trenches and second trenches formed, respectively; filling the first trench and the second trenches with Co, W, or Ru; and planarizing the Co, W, or Ru down to the sidewall spacers.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of reduced density attendant upon forming contact to a gate structure by making contact to a portion of the gate electrode over an isolation region. The problem is solved, inter alia, by forming CA and CB.

Methodology in accordance with embodiments of the present disclosure includes forming first gate structures over a fin of a substrate and second gate structures, each over an outer portion of the fin and a STI layer adjacent to the fin. A first RSD is formed in a portion of the fin between the first gate structures and a second RSD is formed in the portion of the fin between the first gate structures and the second gate structures. The TS structures are then formed over the first RSD and each of the second RSD. A first cap layer is formed over the first gate structures and the second gate structures or over the TS structures. A metal oxide liner is conformally forming over the substrate, a plurality of trenches formed. The plurality of trenches is filled with a second cap layer. An ILD layer is formed over the substrate. A CA is formed through a first portion of the ILD layer and the metal oxide layer down to the TS structures over the second RSD, and a CB is formed through a second portion of the ILD layer and the metal oxide layer down to the first gate structures.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
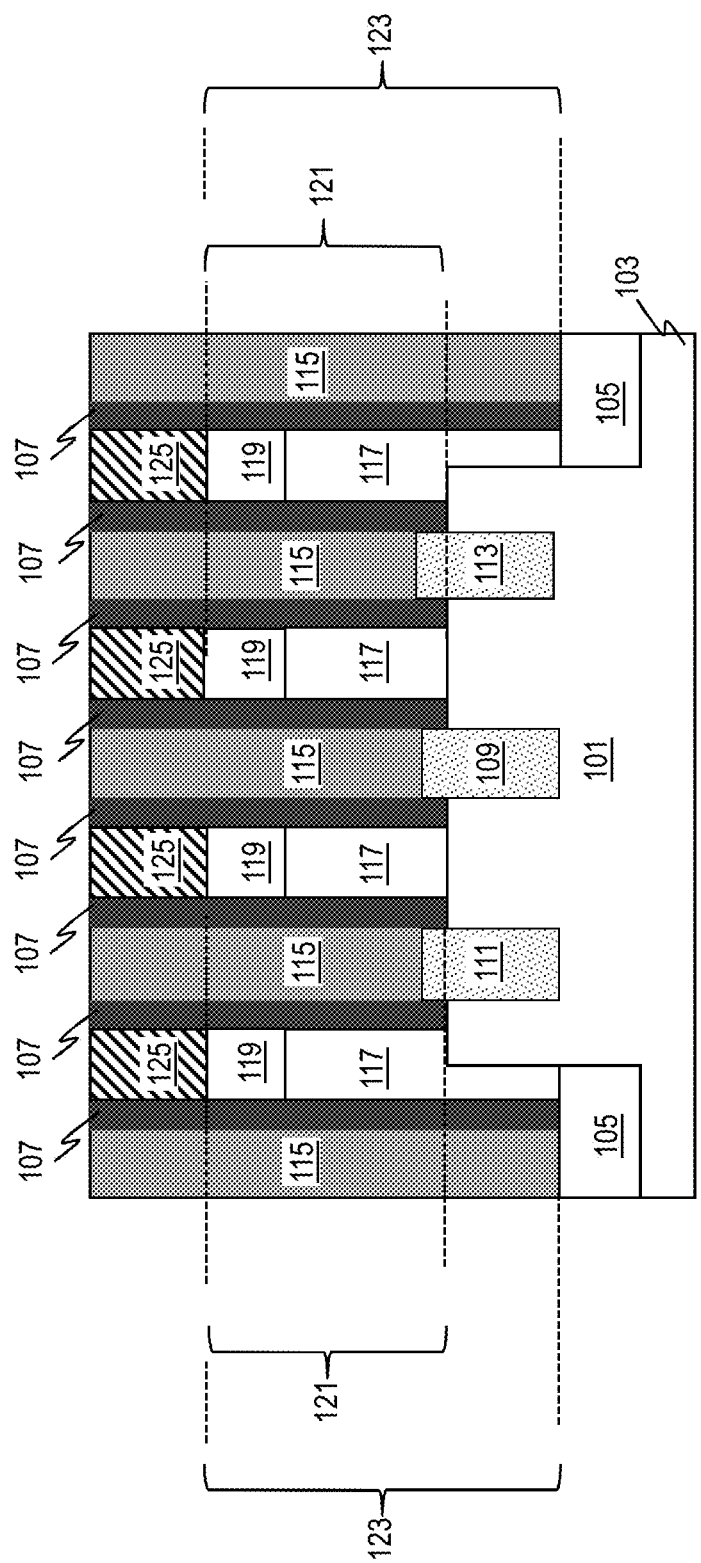
FIGS. 1 through 11 schematically illustrate cross-sectional views of a process flow for forming CA and CB, in accordance with an exemplary embodiment.

FIGS. 1 through 11 schematically illustrate cross-sectional views of a process flow for forming CA and CB, in accordance with an exemplary embodiment. Referring to FIG. 1, first dummy gates (not shown for illustrative convenience) are formed, laterally separated, over a portion of the fin 101 of the substrate 103, and second dummy gates (not shown for illustrative convenience) are formed, laterally separated, over an outer portion of the fin 101 and the STI layer 105 adjacent to the fin 101. In one instance, the STI layer 105 includes $SiO_2$ or the like materials. Thereafter, sidewall spacers 107 are formed, e.g., of SiOCN, $SiO_2$, SiN, SiCN, SiOC or the like materials, on the sidewalls of the first dummy gates and the second dummy gates to a width, e.g., of 2 nm to 10 nm, by chemical vapor deposition (CVD). Next, RSD 109 is formed in a portion of the fin 101 between the first dummy gates, and RSD 111 and 113 are formed in a portion of the fin 101 between the first dummy gates and the second dummy gates. In one instance, the RSD 109, 111 and 113 includes epitaxial (EPI) material, wherein EPI material for an NFET RSD is silicon-phosphorus (SiP) by a P-type doping and for a PFET RSD is silicon germanium (SiGe) by a B-type doping. Subsequently, an ILD layer 115 is formed, e.g., of $SiO_2$, SiOC, SiN or the like materials, over the substrate 103, and is planarized down to the sidewall spacers 107. Then, the first dummy gates and the second dummy gates are removed. Thereafter, a HKMG layer 117 is formed, e.g., to a thickness of 2 nm to 10 nm, between and along a portion of the sidewall spacers 107. Pursuant to this, a metal layer 119 is formed, e.g., of Co, W or Ru, over the HKMG layer 117 and between and along the second portion of the sidewall spacers 107 to a thickness, e.g., of 10 nm to 100 nm, forming gate structures 121 and 123, respectively. Subsequently, a cap layer is formed, e.g., of SiN, SiCN, SiOCN, SiOC or the like materials, over the ILD layer 115, the sidewall spacers 107 and the gate structures 121 and 123 to a thickness, e.g., of 10 nm to 100 nm. Then, the cap layer is planarized down to the sidewall spacers 107, forming cap layer 125.

Figure 2:
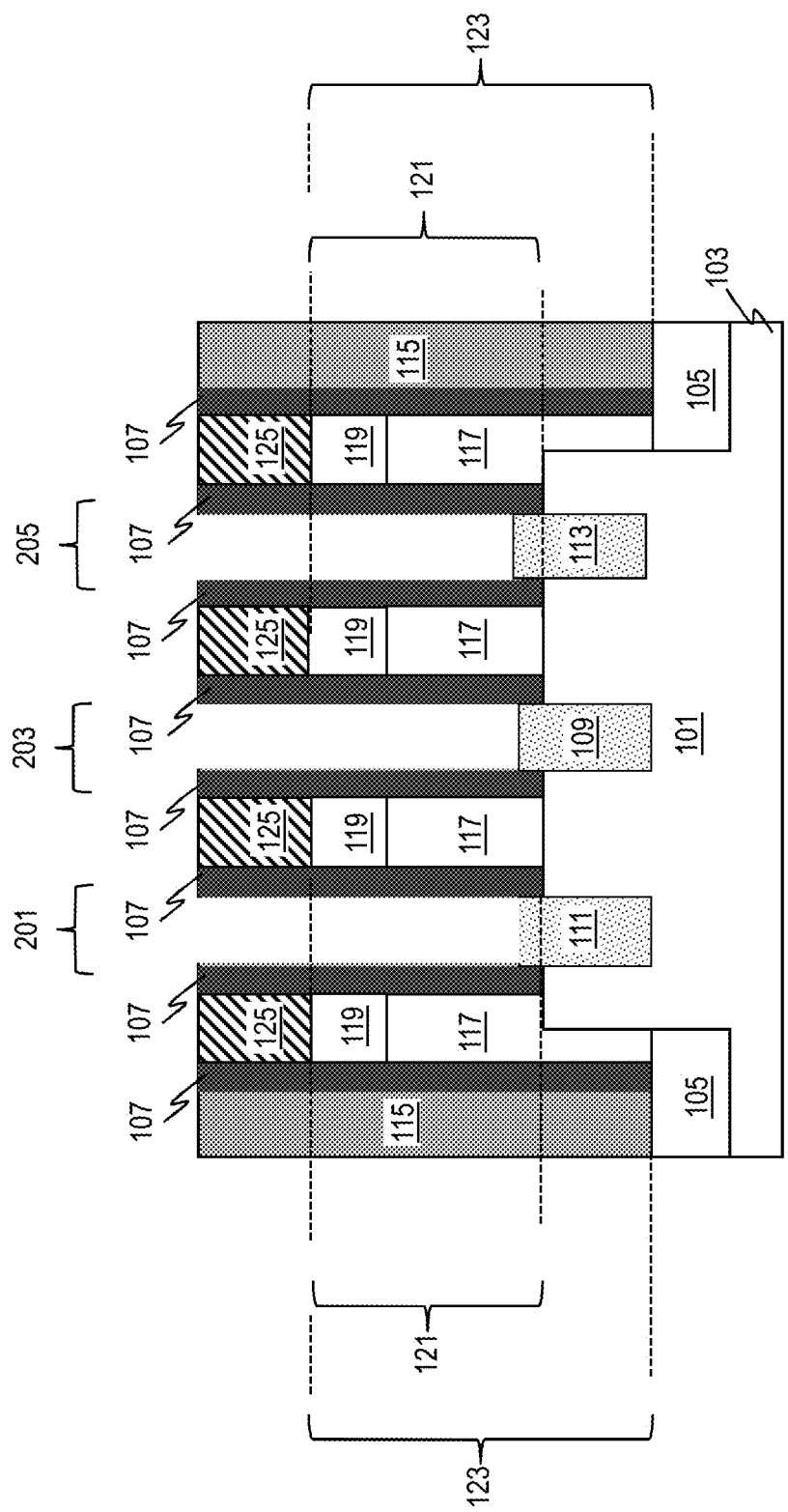
Figure 3:
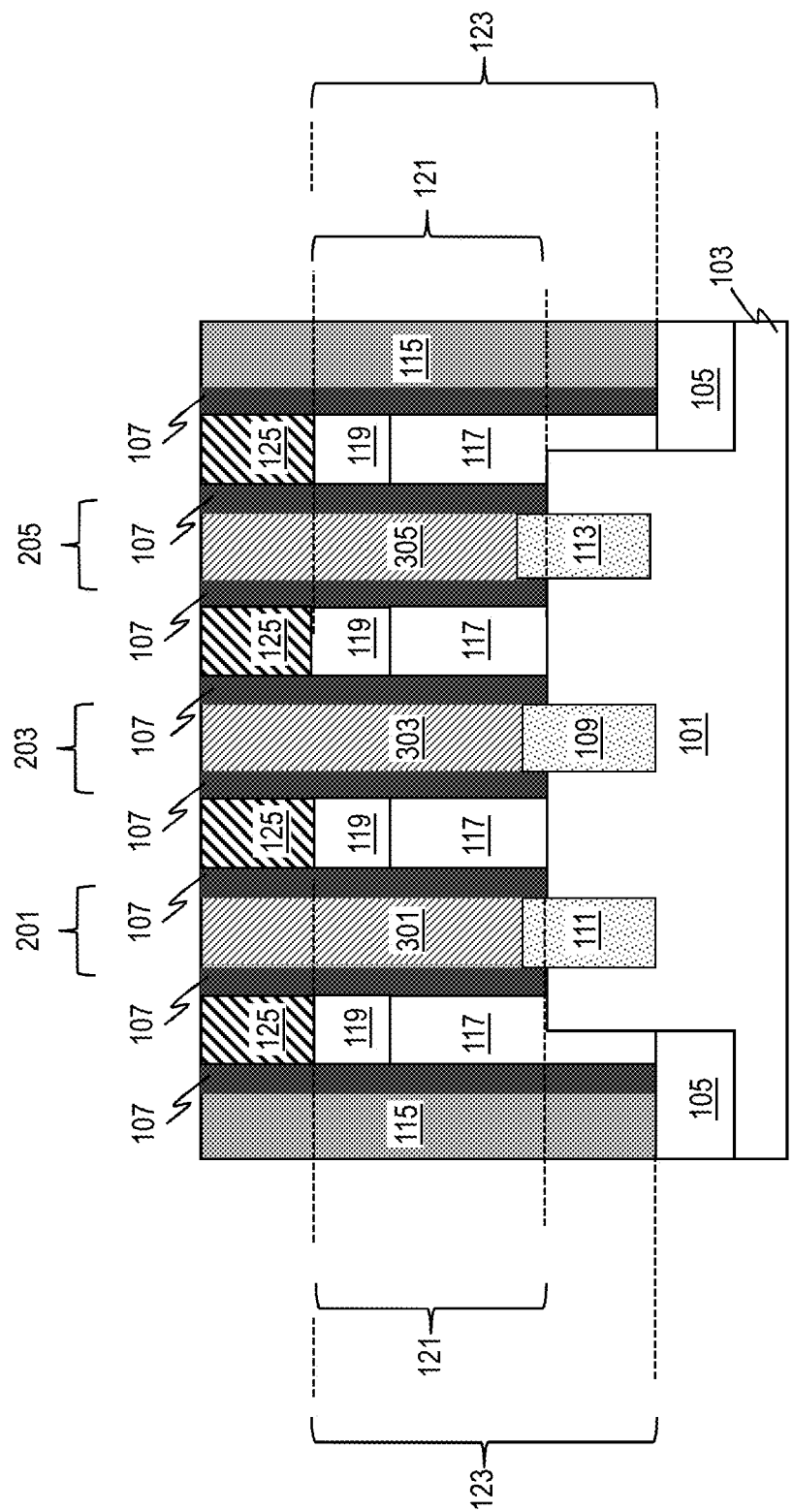
Figure 4:
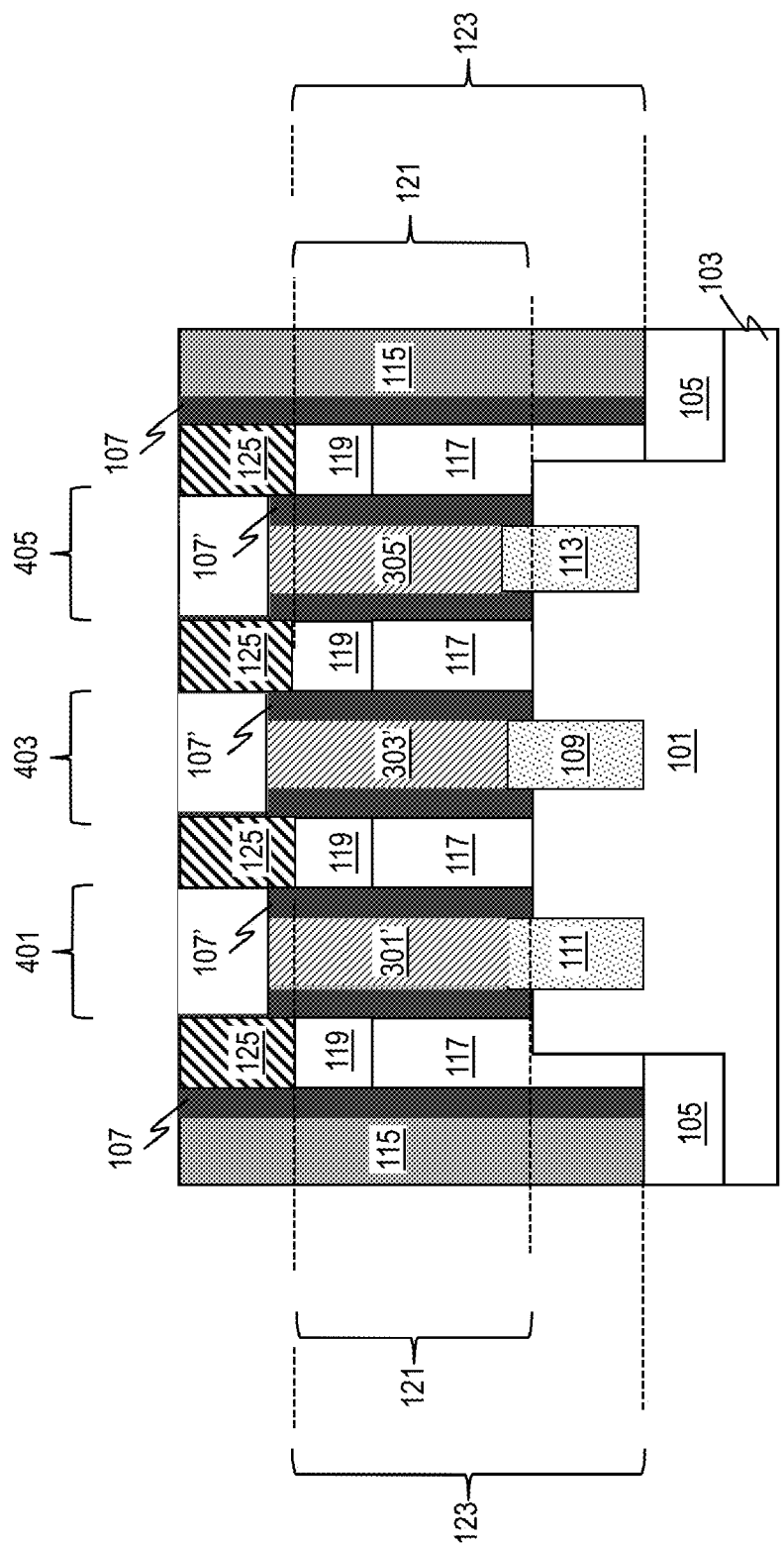

As illustrated in FIG. 2, the ILD layer 115 between the sidewall spacers 107 and over the RSD 109, 111 and 113 is removed by reactive ion etching (RIE), forming trenches 201, 203 and 205. After that, the trenches 201, 203 and 205 are filled with metal, e.g., Co, W or Ru, by CVD to a thickness, e.g., of 50 nm to 200 nm. Then, the metal is planarized down to the sidewall spacers 107, forming TS structures 301, 303 and 305, as depicted in FIG. 3. Next, in FIG. 4, the TS structures 301, 303 and 305 and the adjacent sidewall spacers 107 are recessed by RIE or wet etch, forming TS structures 301', 303' and 305', the sidewall spacers 107' and trenches 401, 403 and 405.

Figure 5:
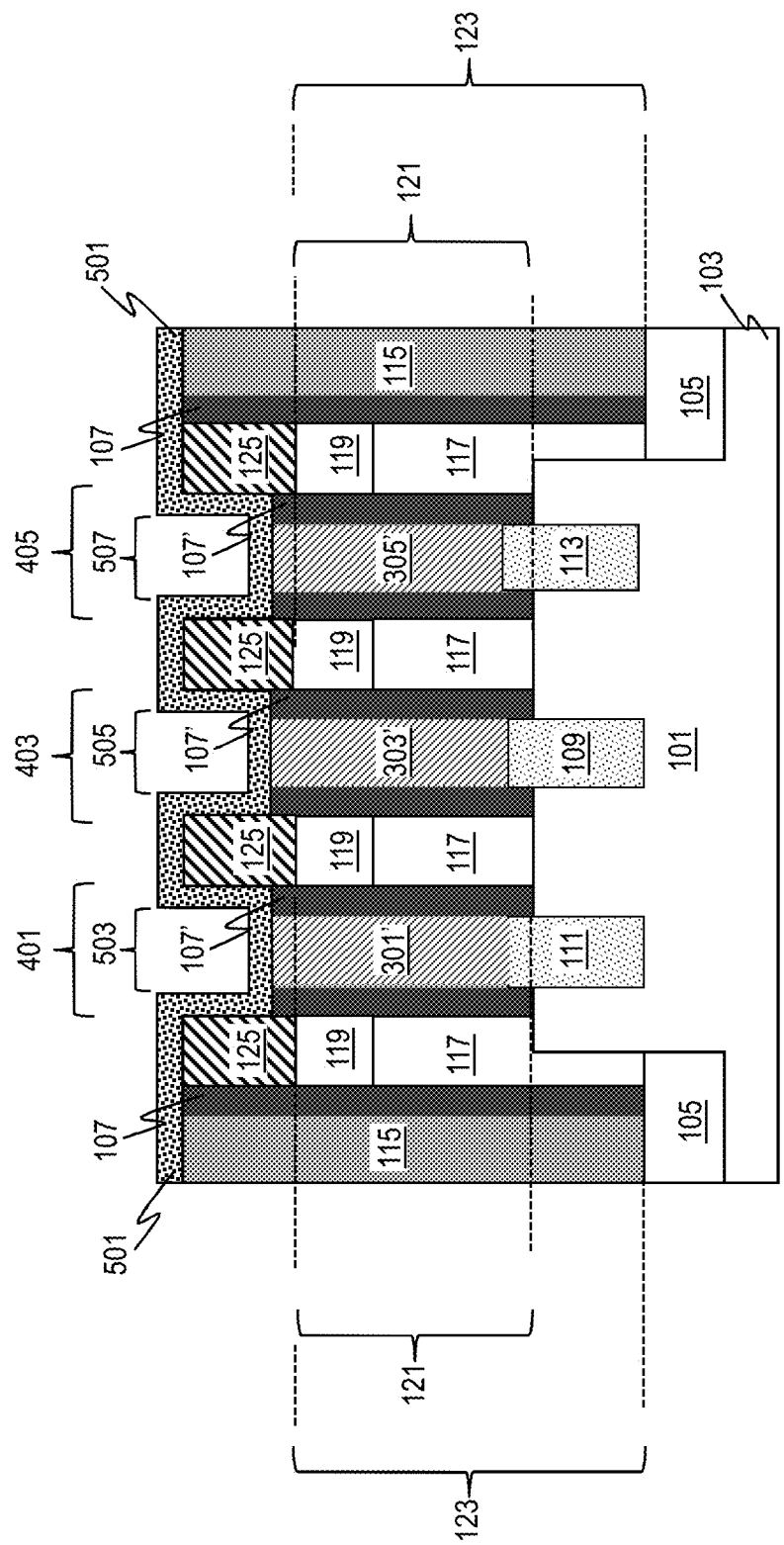
Figure 6:
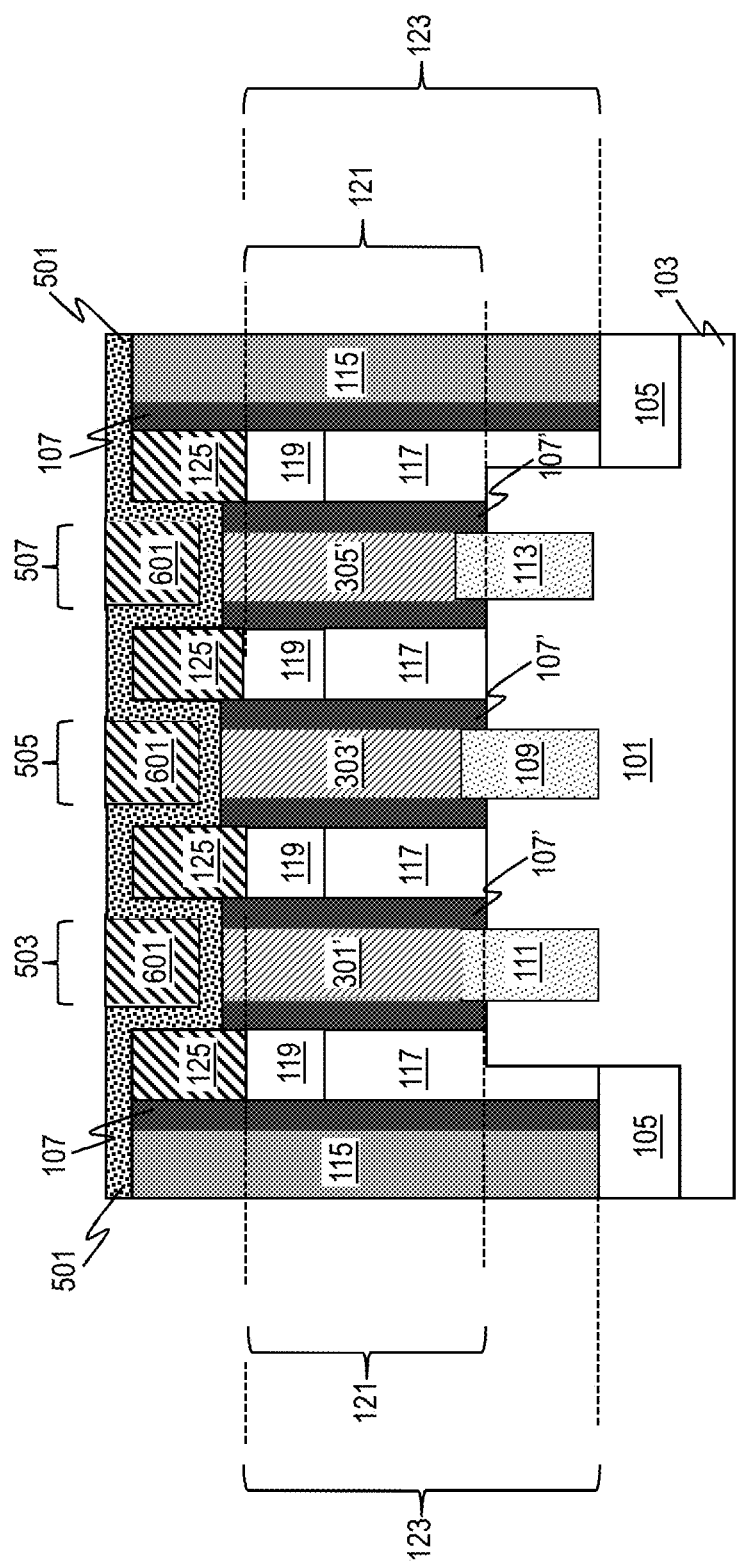
Figure 7:
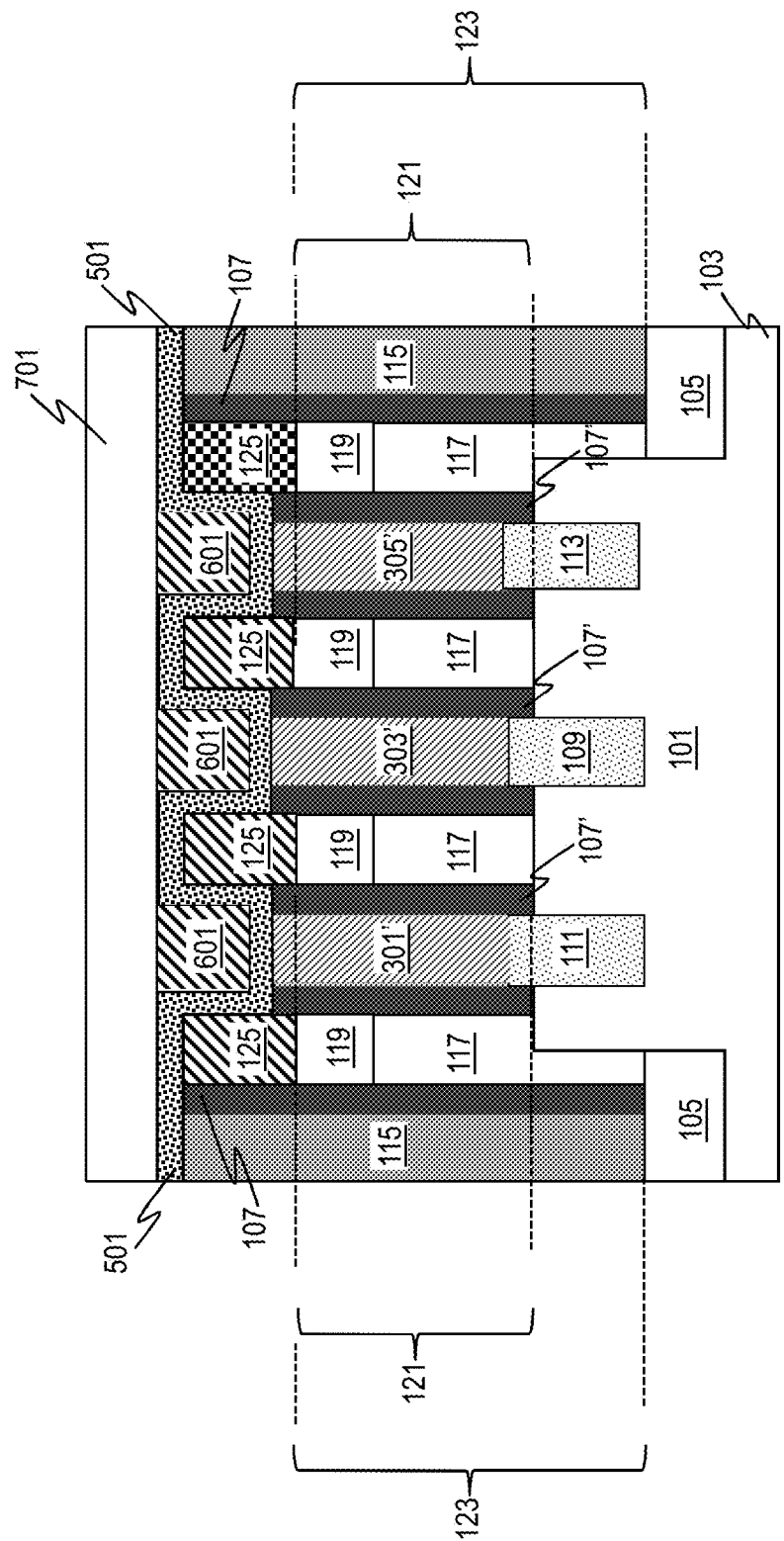

Referring to FIG. 5, a metal oxide liner 501 is conformally formed, e.g., of $Al_2O_3$, $TiO_2$, $HfO_2$ or the like materials by ALD, over the ILD layer 115, the sidewall spacers 107, the cap layer 125 and the trenches 401, 403 and 405 to a thickness, e.g., of 2 nm to 10 nm, thereby forming trenches 503, 505 and 507. Next, the trenches 503, 505 and 507 are filled with a cap layer 601 including SiN, SiCN, SiOCN, SiOC or the like materials, as depicted in FIG. 6. Thereafter, ILD layer 701 is formed over the metal oxide liner 501 and the cap layer 601, as shown in FIG. 7.

Figure 8:
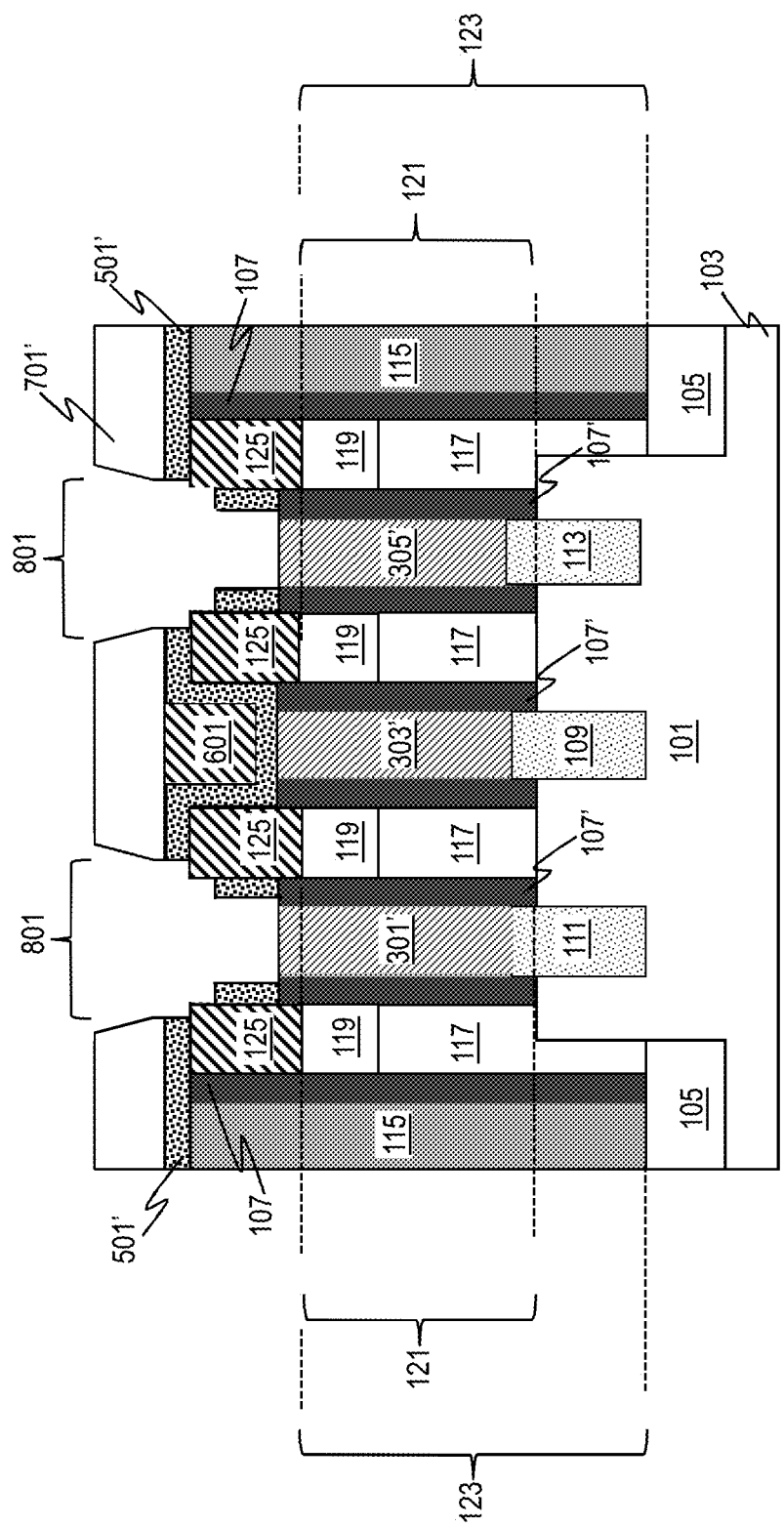

Subsequently, in FIG. 8, a first portion of the ILD layer 701 is etched, forming ILD layer 701'. This is followed by removal of the cap layer 601 over the TS structures 301' and 305'. Consequently, a first portion of the metal oxide layer 501 is etched down to the TS structures 301' and 305', forming metal oxide layer 501' and trench 801. Then, in FIG. 10, the trench 801 is filled with metal layer 1001, e.g., Co, W or Ru, forming a CA to RSD 111 and 113. The upper surface of the metal layer 1001 is coplanar to the upper surface of the ILD layer 701'.

Figure 9:
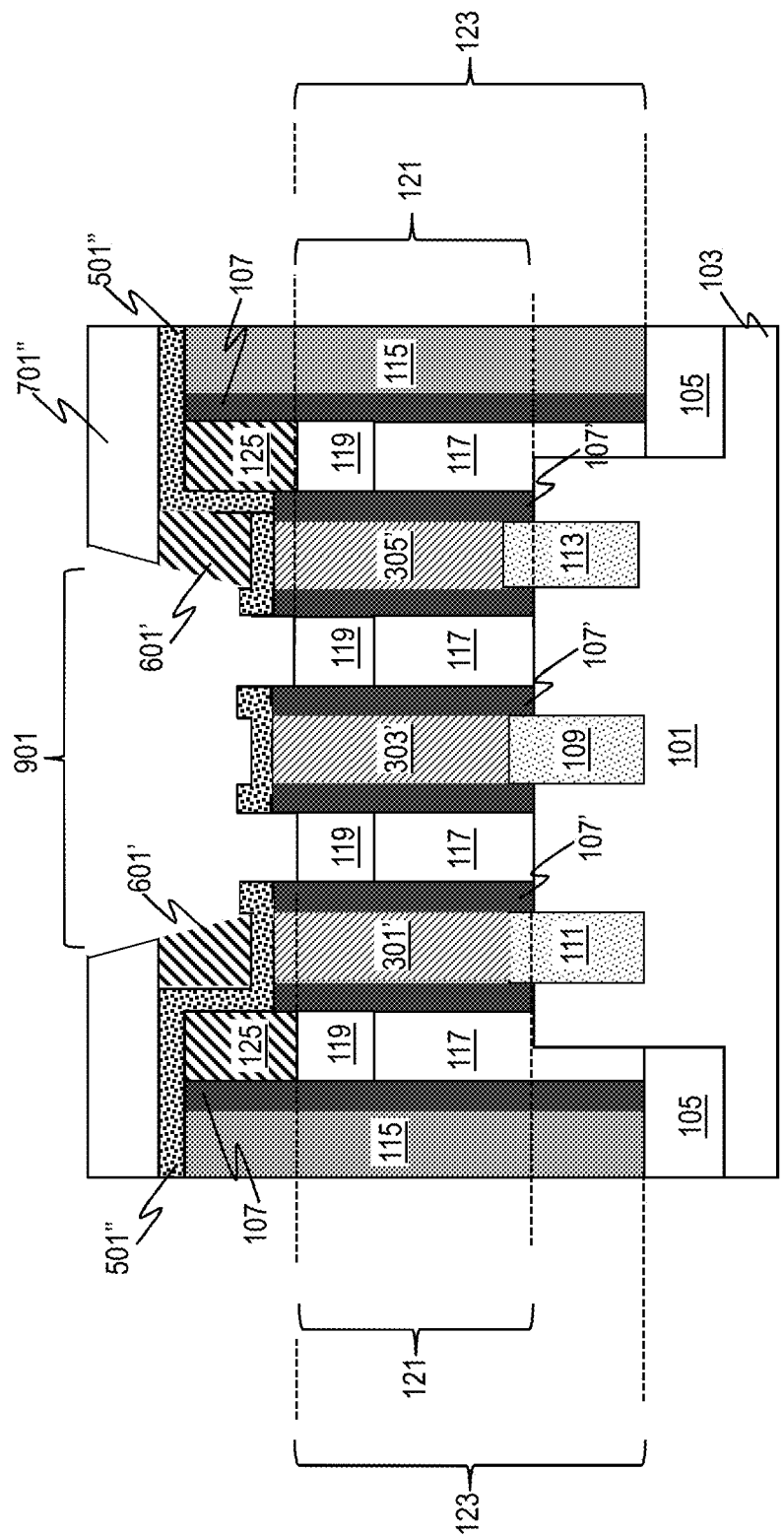
Figure 10:
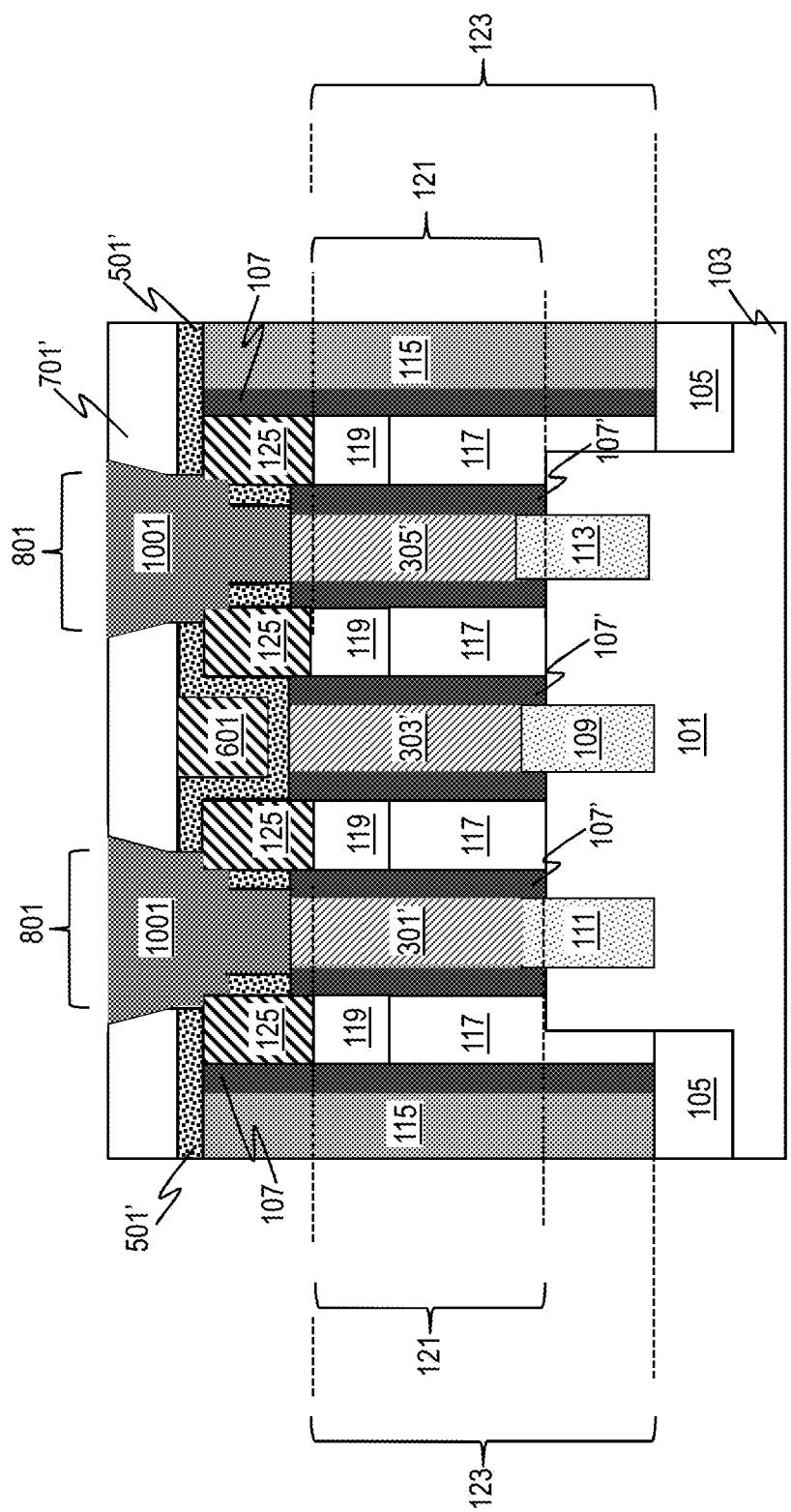
Figure 11:
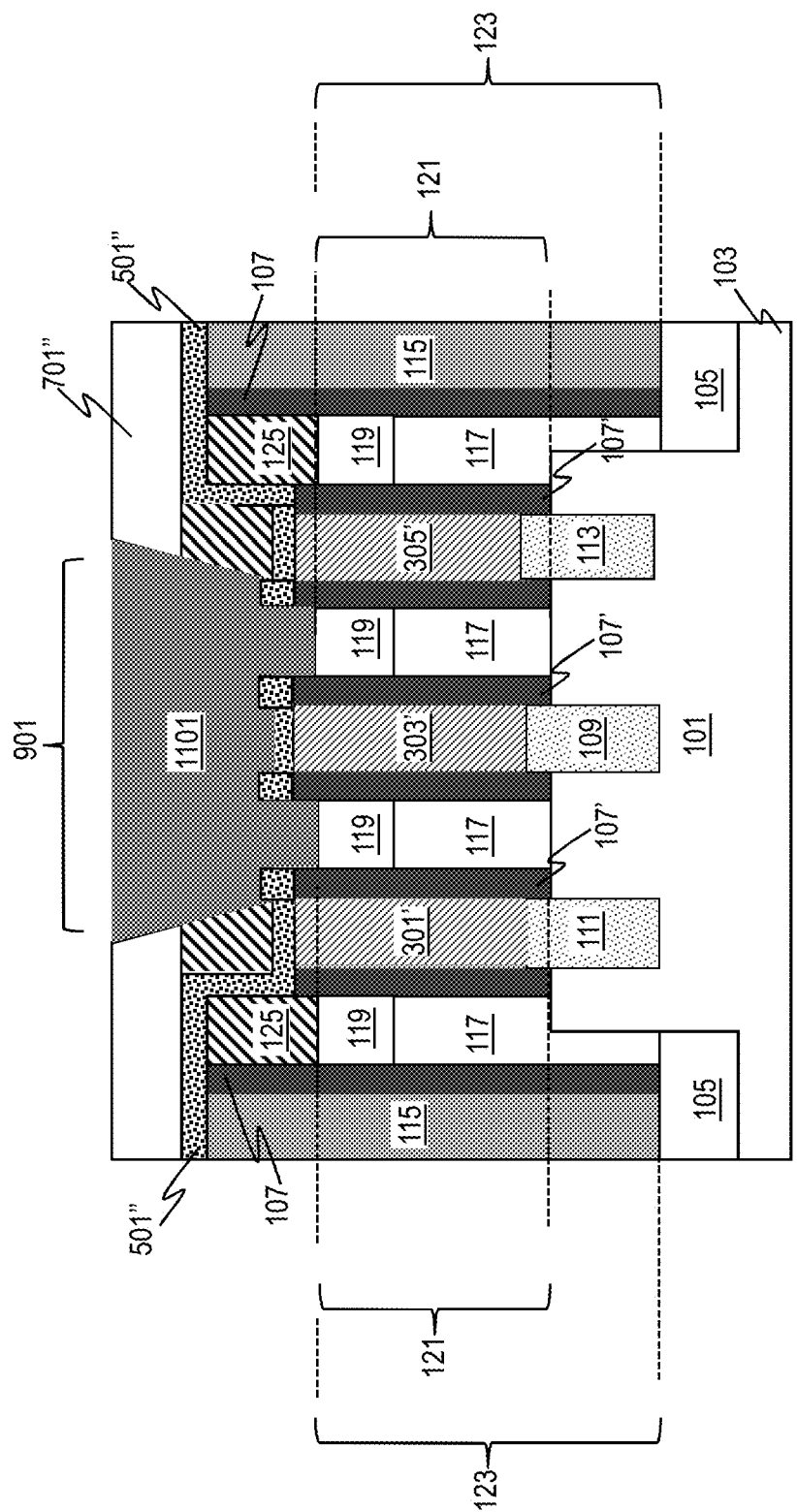

Referring to FIG. 9, a second portion of the ILD layer 701' is etched, forming ILD layer 701". This is followed by removal of the cap layer 601 over the TS structures 303'. It is understood that portions of the cap layer 601 over the TS structures 301' and 305' may be removed during formation of the CB, forming cap layer 601'. Next, a second portion of the metal oxide layer 501' is etched down to the cap layer 125 over the gate structures 121, forming metal oxide layer 501". Subsequently, the cap layer 125 is removed, forming trench 901. Thereafter, in FIG. 11, the trench 901 is filled with metal layer 1101, e.g., Co, W or Ru, forming a CB to gate structures 121. The upper surface of the metal layer 1101 is coplanar to the upper surface of the ILD layer 701".

Figure 12:
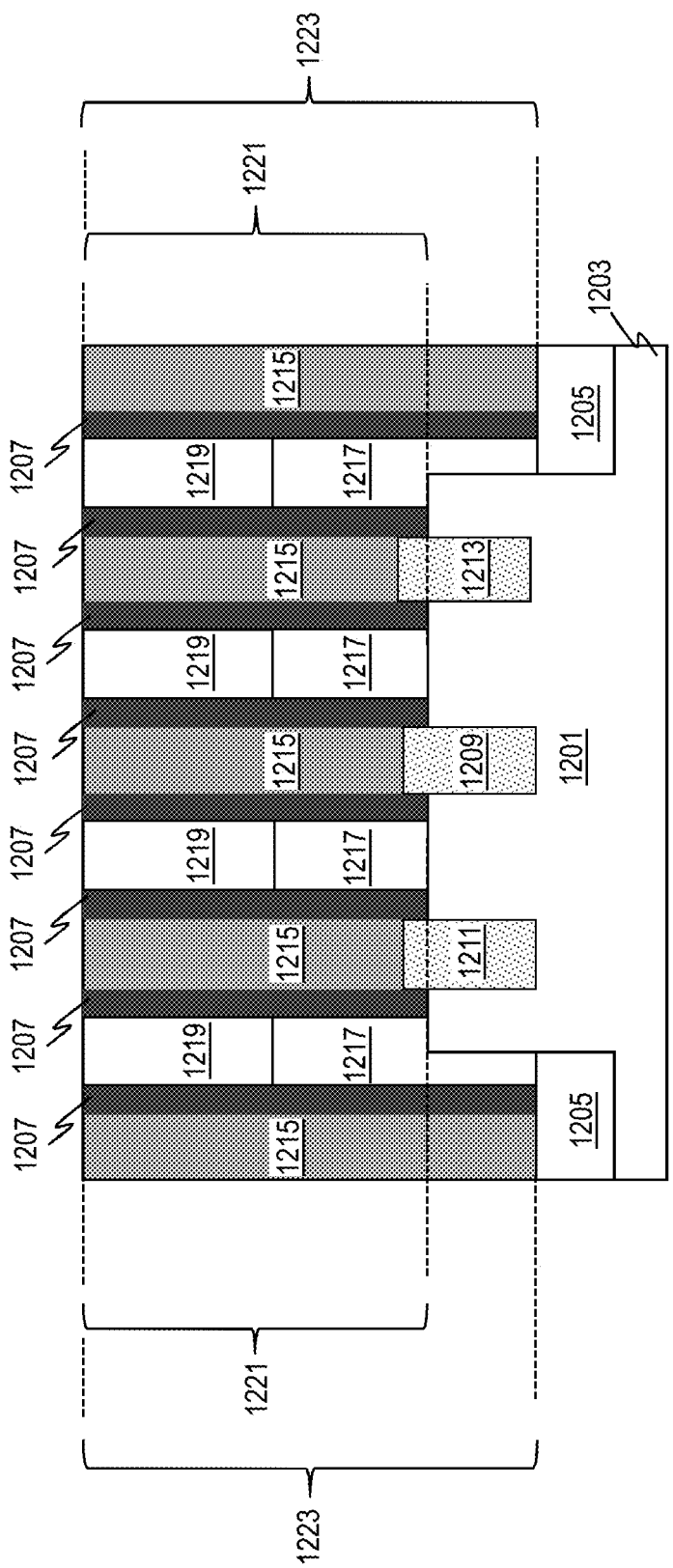
FIGS. 12 through 24 schematically illustrate cross-sectional views of a process flow for forming CA and CB, in accordance with an exemplary embodiment.

FIGS. 12 through 24 schematically illustrate cross-sectional views of a process flow for forming CA and CB, in accordance with an exemplary embodiment. Referring to FIG. 12, similar to the process steps described with respect to FIG. 1 above a first dummy gates (not shown for illustrative convenience) are formed, laterally separated, over a portion of the fin 1201 of the substrate 1203, and second dummy gates (not shown for illustrative convenience) are formed, laterally separated, over the outer portion of the fin 1201 and the STI layer 1205 adjacent to the fin 1201. In one instance, the STI layer 1205 includes $SiO_2$ or the like materials. Thereafter, sidewall spacers 1207 are formed, e.g., of SiOCN, $SiO_2$, SiN, SiCN, SiOC or the like materials, on the sidewalls of the first dummy gates and the second dummy gates to a width, e.g., of 2 nm to 10 nm, by CVD. Next, RSD 1209 is formed in a portion of the fin 1201 between the first dummy gates, and RSD 1211 and 1213 are formed in a portion of the fin 1201 between the first dummy gates and the second dummy gates. In one instance, the RSD 1209, 1211 and 1213 includes EPI material, wherein EPI material for an NFET RSD is SiP by a P-type doping and for a PFET RSD is SiGe by a B-type doping. Subsequently, an ILD layer 1215 is formed, e.g., of $SiO_2$, SiOC, SiN or the like materials, over the substrate 1203, and is planarized down to the sidewall spacers 1207. Then, the first dummy gates and the second dummy gates are removed. Thereafter, a HKMG layer 1217 is formed, e.g., to a thickness of 2 nm to 10 nm, between and along a portion of the sidewall spacers 1207. Pursuant to this, a metal layer 1219 is formed, e.g., of Co, W or Ru, over the HKMG layer 1217 and between and along the remaining portion of the sidewall spacers 1207, forming gate structures 1221 and 1223, respectively.

Figure 13:
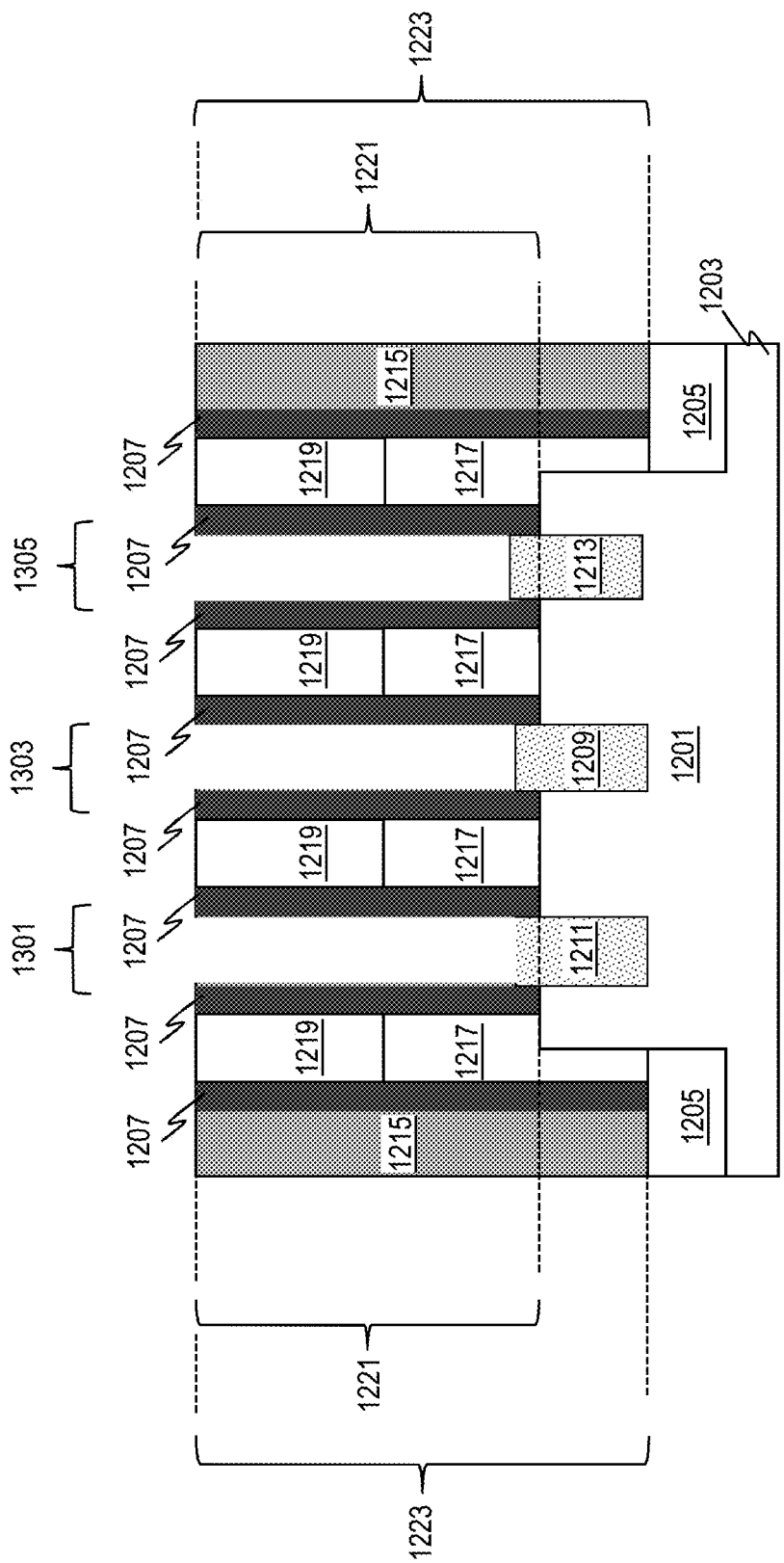
Figure 14:
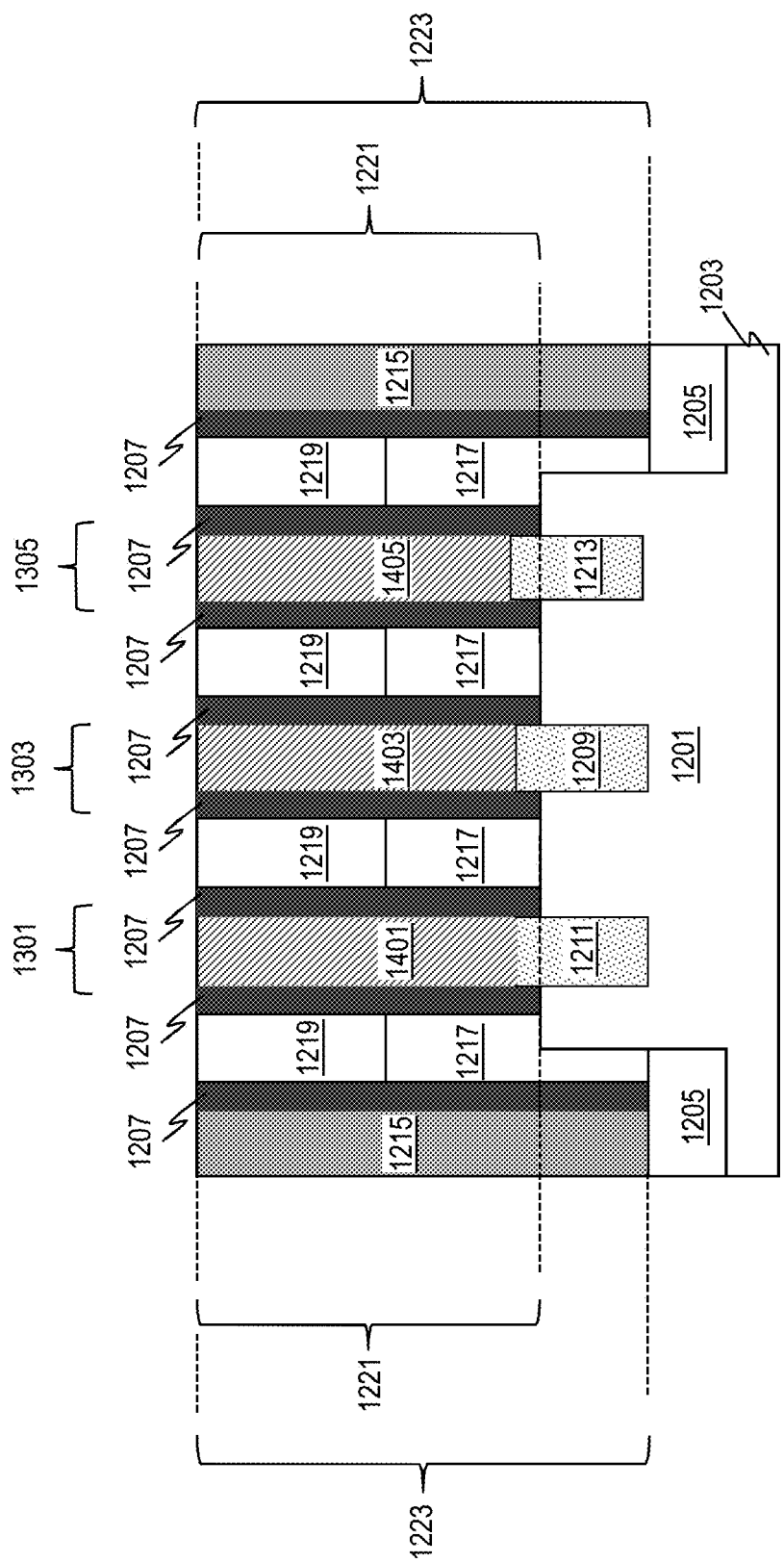
Figure 15:
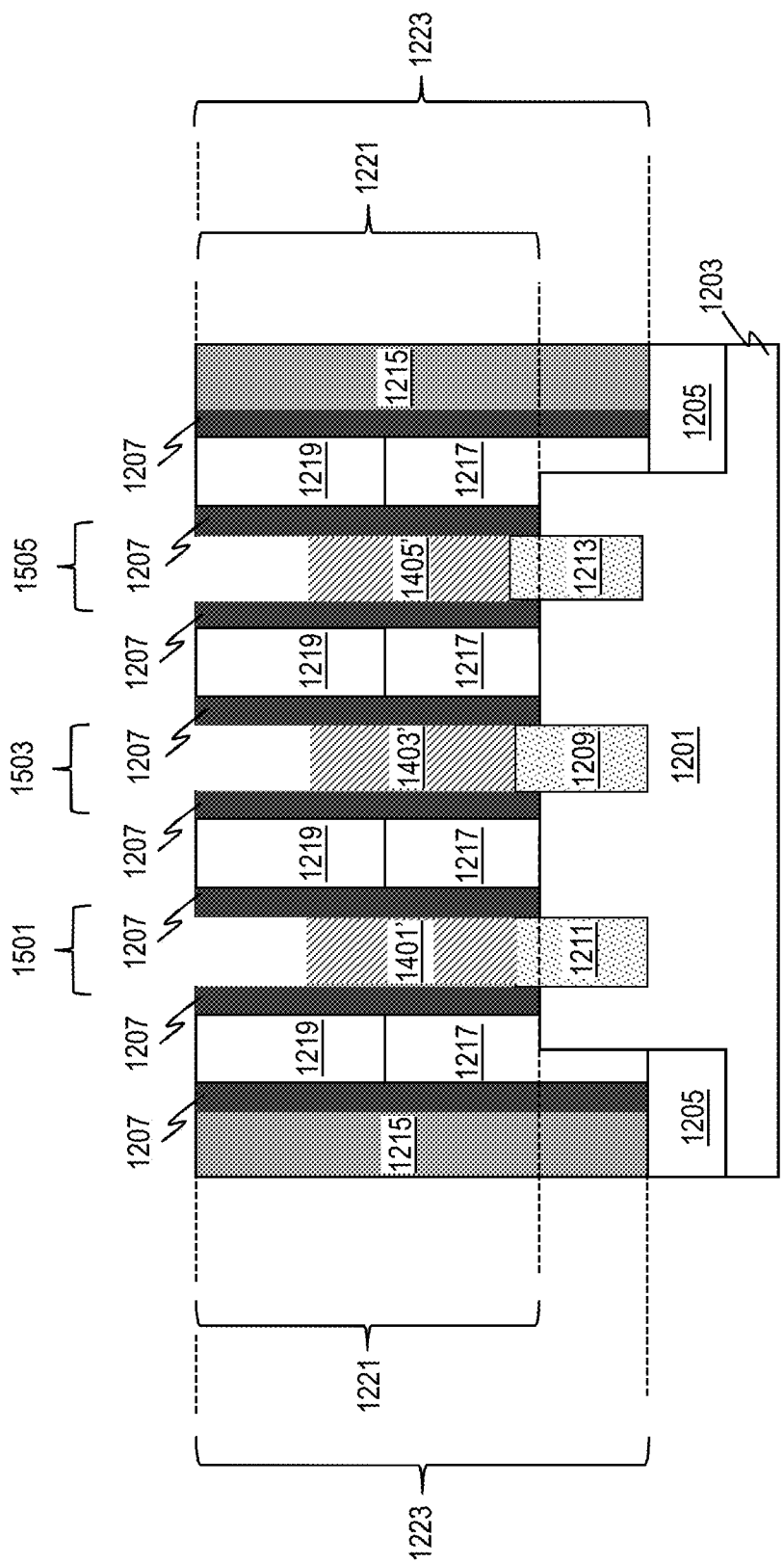
Figure 16:
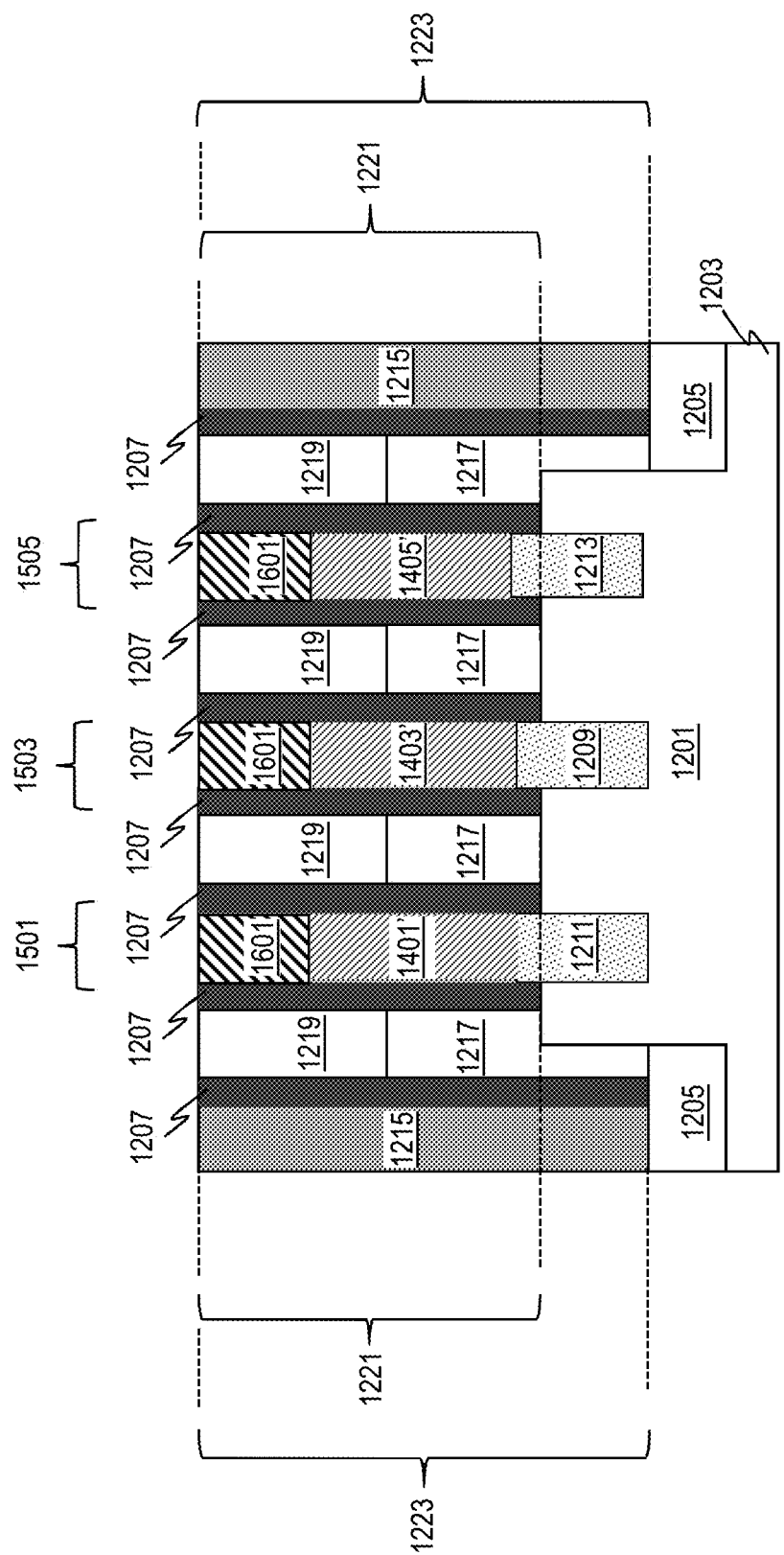

As illustrated in FIG. 13, the ILD layer 1215 between the sidewall spacers 1207 and over the RSD 1209, 1211 and 1213 is removed by RIE, forming trenches 1301, 1303 and 1305. After that, the trenches 1301, 1303 and 1305 are filled with metal, e.g., Co, W or Ru, by CVD to a thickness, e.g., of 50 nm to 200 nm. Then, the metal is planarized down to the sidewall spacers 1207, forming TS structures 1401, 1403 and 1405, as depicted in FIG. 14. Next, in FIG. 15, the TS structures 1401, 1403 and 1405 are recessed by RIE or wet etch, forming TS structures 1401', 1403' and 1405' and trenches 1501, 1503 and 1505. Thereafter, in FIG. 16, a cap layer including SiN, SiCN, SiOCN, SiOC or the like materials is formed over the TS structures 1401', 1403' and 1405', filling the trenches 1501, 1503 and 1505. Then, the cap layer is planarized down to the sidewall spacers 1207, forming cap layer 1601.

Figure 17:
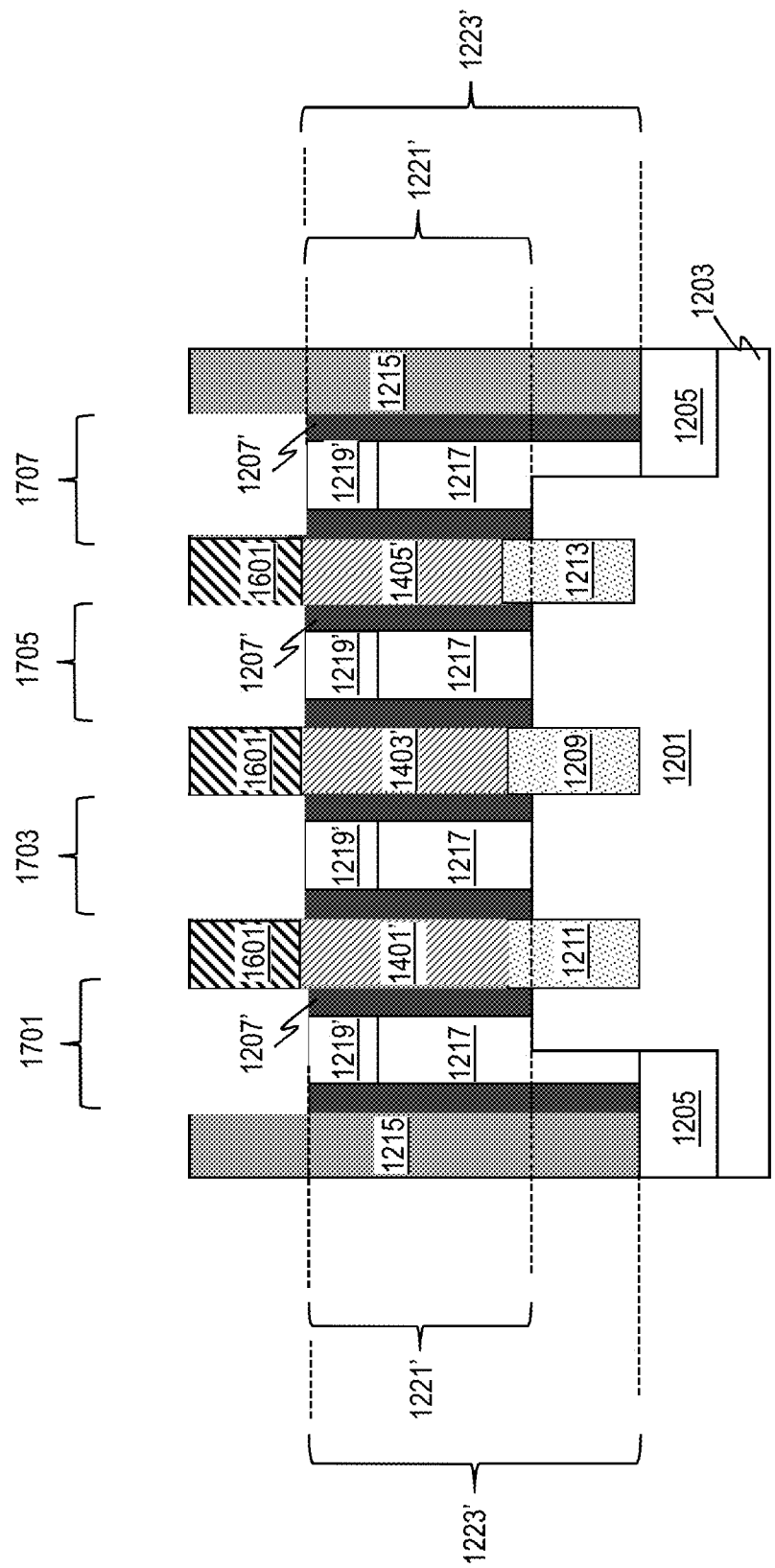
Figure 18:
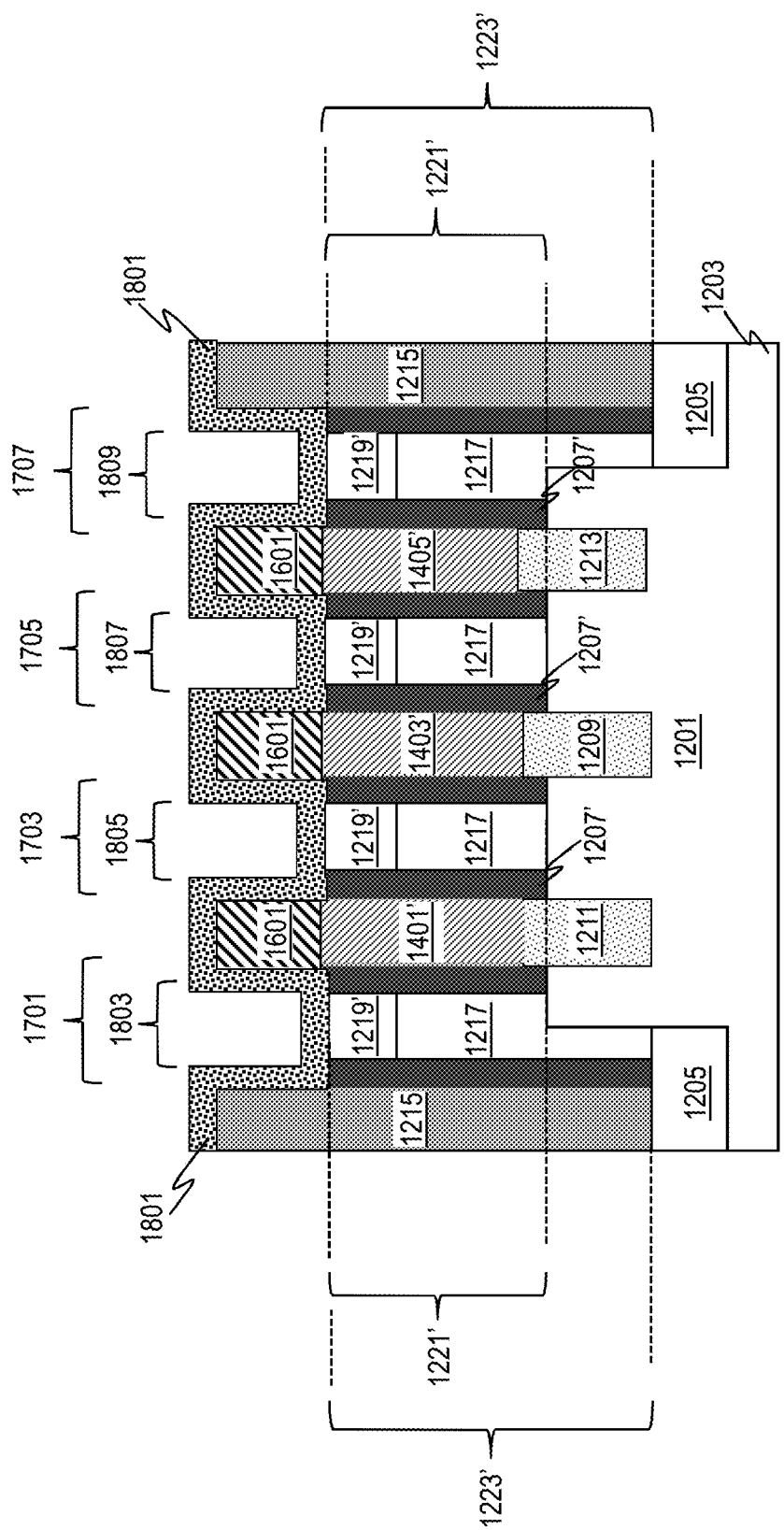
Figure 19:
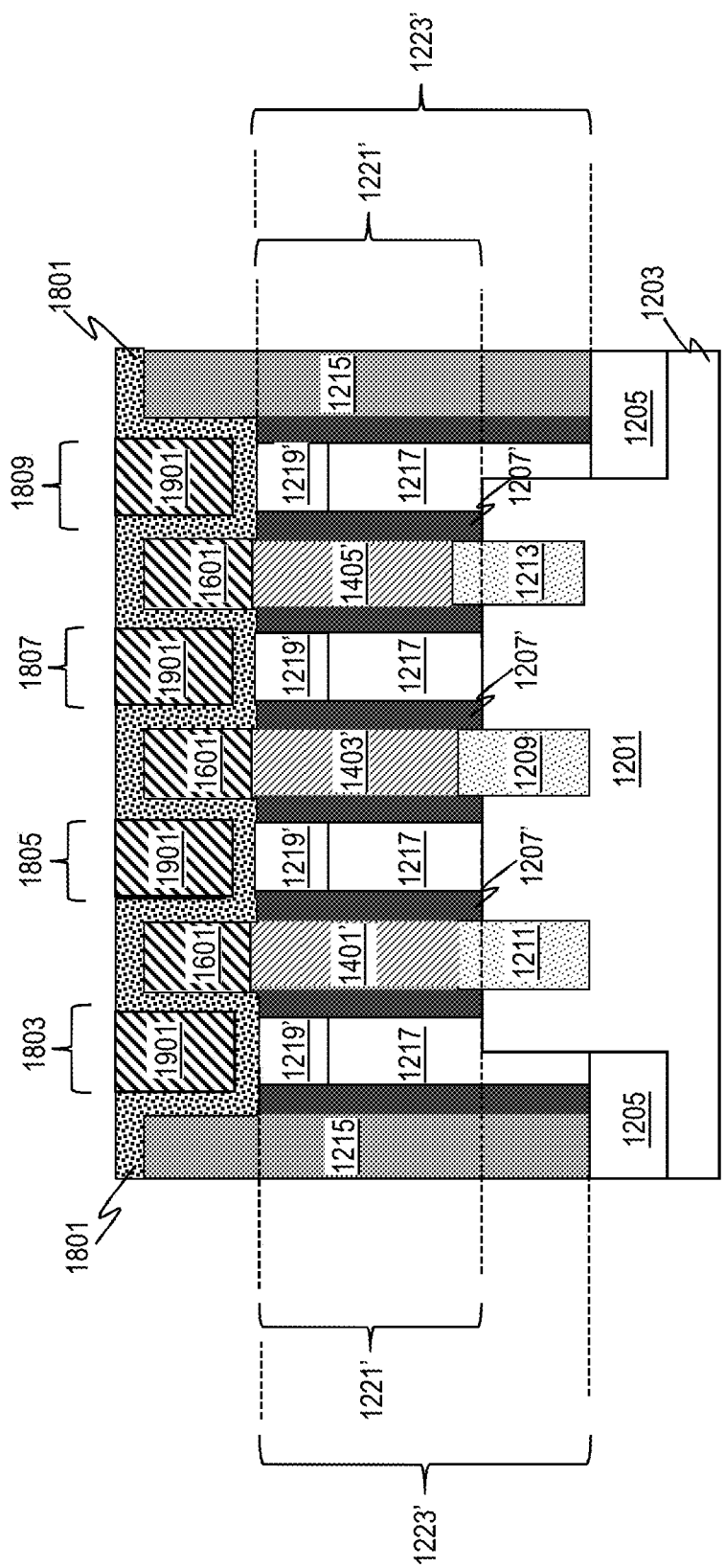
Figure 20:
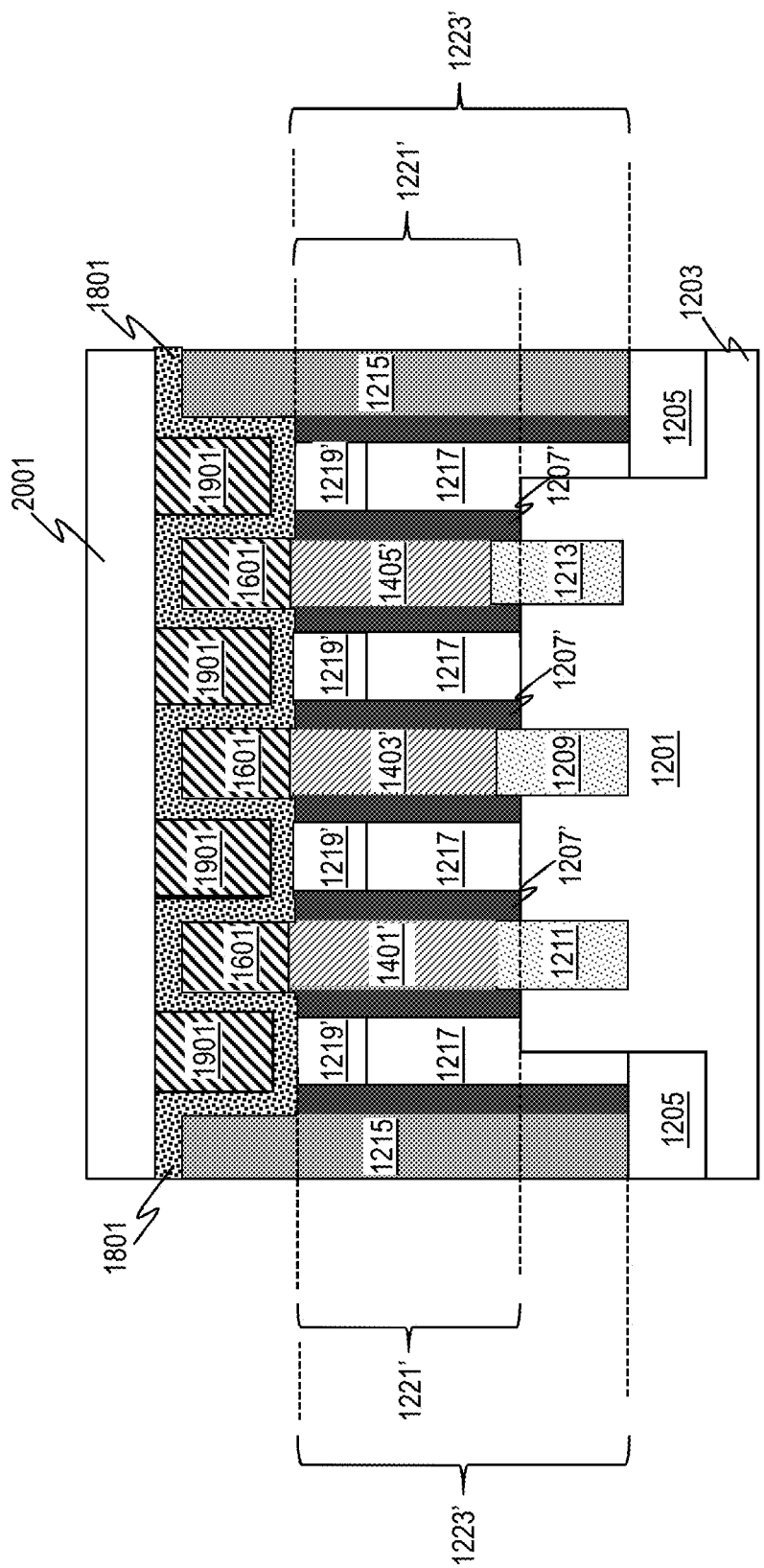

Referring to FIG. 17, the metal layer 1219 and adjacent sidewall spacers 1207 are recessed, forming metal layer 1219', sidewall spacers 1207', trenches 1701, 1703, 1705 and 1707 and gate structures 1221' and 1223'. Thereafter, in FIG. 18, a metal oxide liner 1801 is conformally formed, e.g., of $Al_2O_3$, $TiO_2$ or $HfO_2$ by ALD, over the ILD layer 1215, the trenches 1701, 1703, 1705 and 1707, and the cap layer 1601 to a thickness, e.g., of 2 nm to 10 nm, thereby forming trenches 1803, 1805, 1807 and 1809. Next, the trenches 1803, 1805, 1807 and 1809 are filled with cap layer 1901 including SiN, SiCN, SiOCN, SiOC or the like materials, as depicted in FIG. 19. Thereafter, an ILD layer 2001 is formed over the metal oxide liner 1801 and the cap layer 1901, as shown in FIG. 20.

Figure 21:
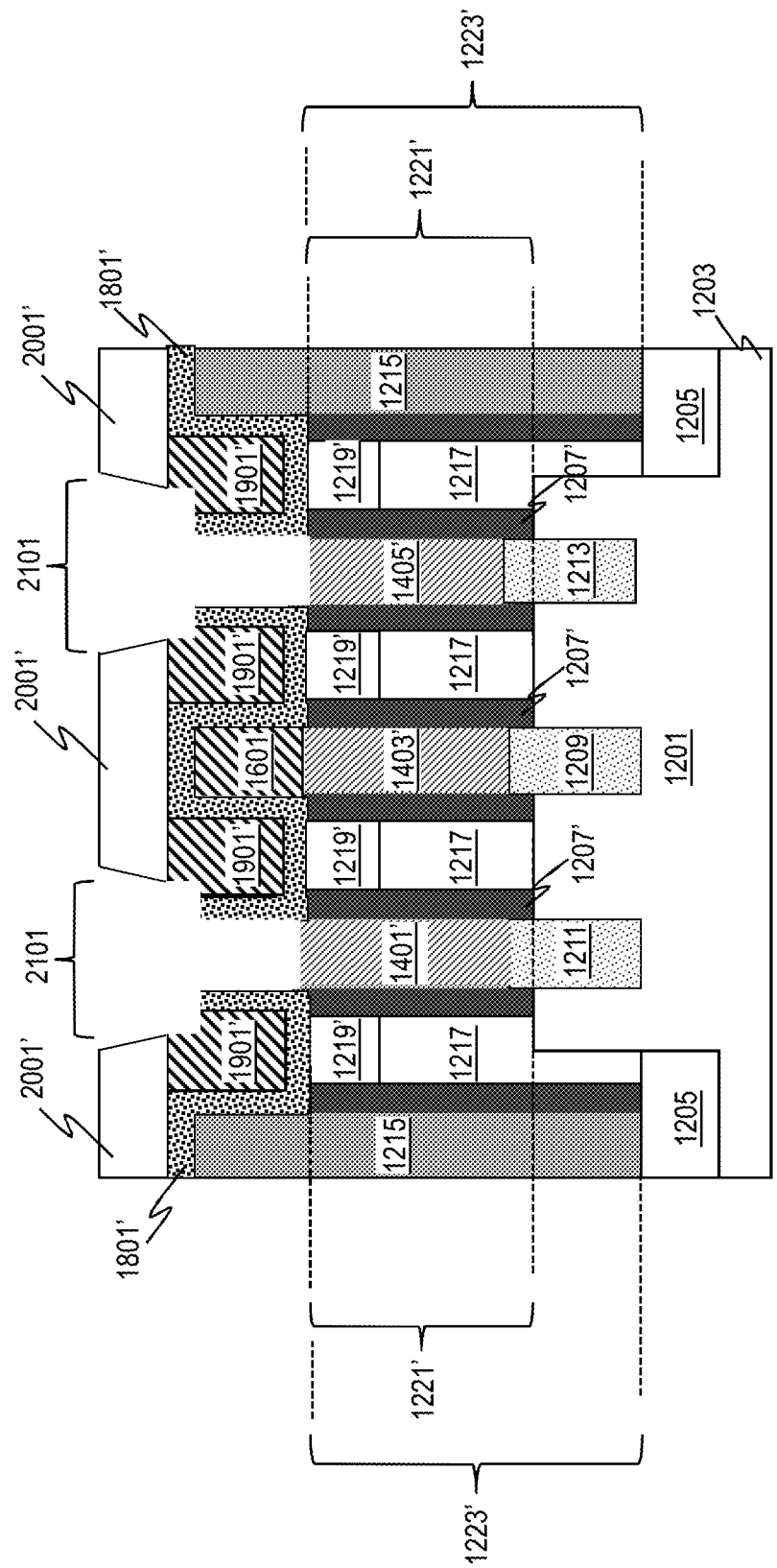
Figure 23:
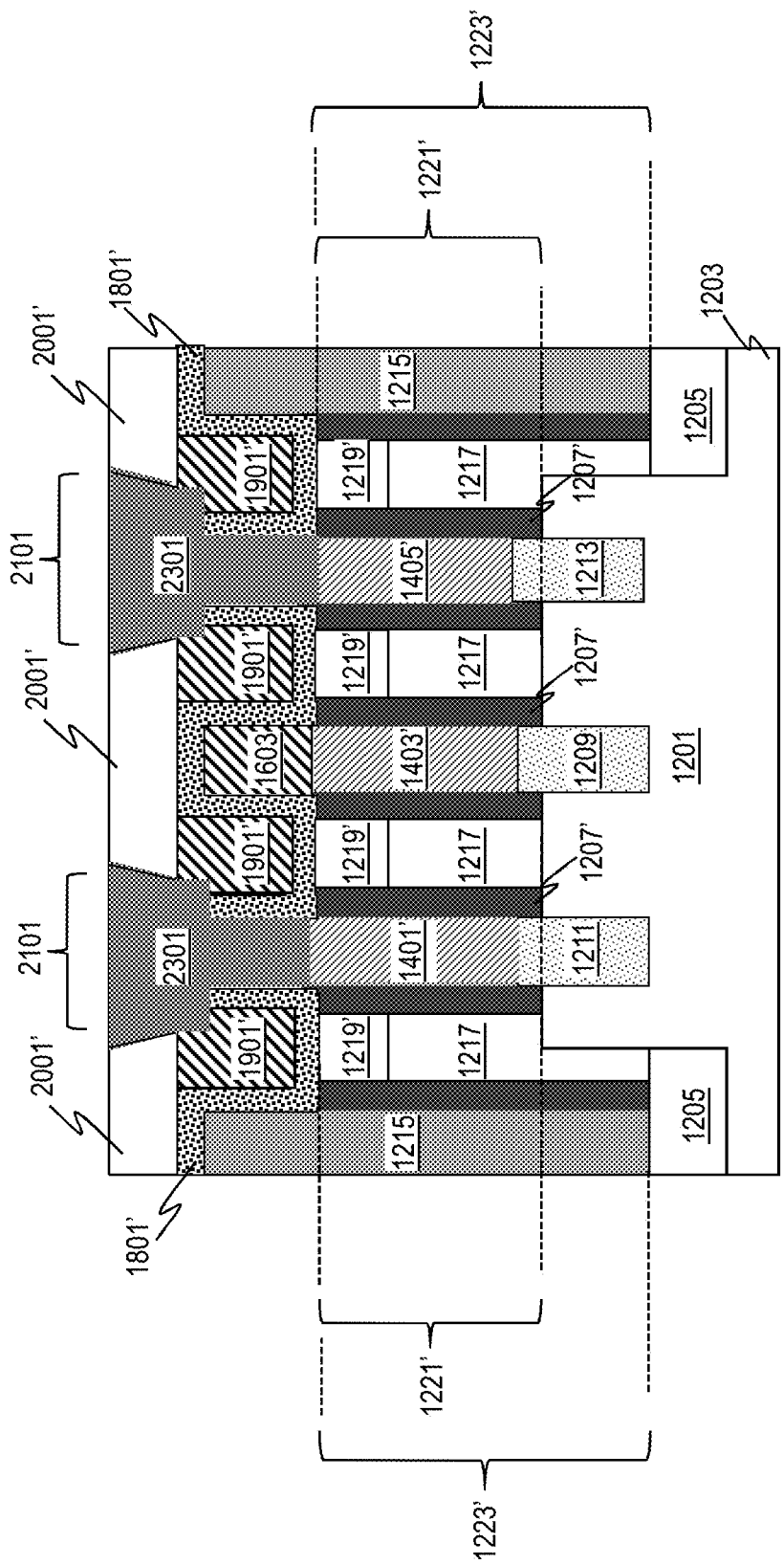

Subsequently, in FIG. 21, a first portion of the ILD layer 2001 is etched, forming ILD layer 2001'. Then, a first portion of the metal oxide layer 1801 and the cap layer 1901 is etched down to cap layer 1601 over the TS structures 1401' and 1405'. Next, the cap layer 1601 over the TS structures 1401' and 1405' is removed, forming trench 2101. Subsequently, the trench 2101 is filled with metal layer 2301, e.g., Co, W or Ru, forming a CA to RSD 1211 and 1213, as depicted in FIG. 23. The upper surface of the metal layer 2301 is coplanar to the upper surface of the ILD layer 2001'.

Figure 22:
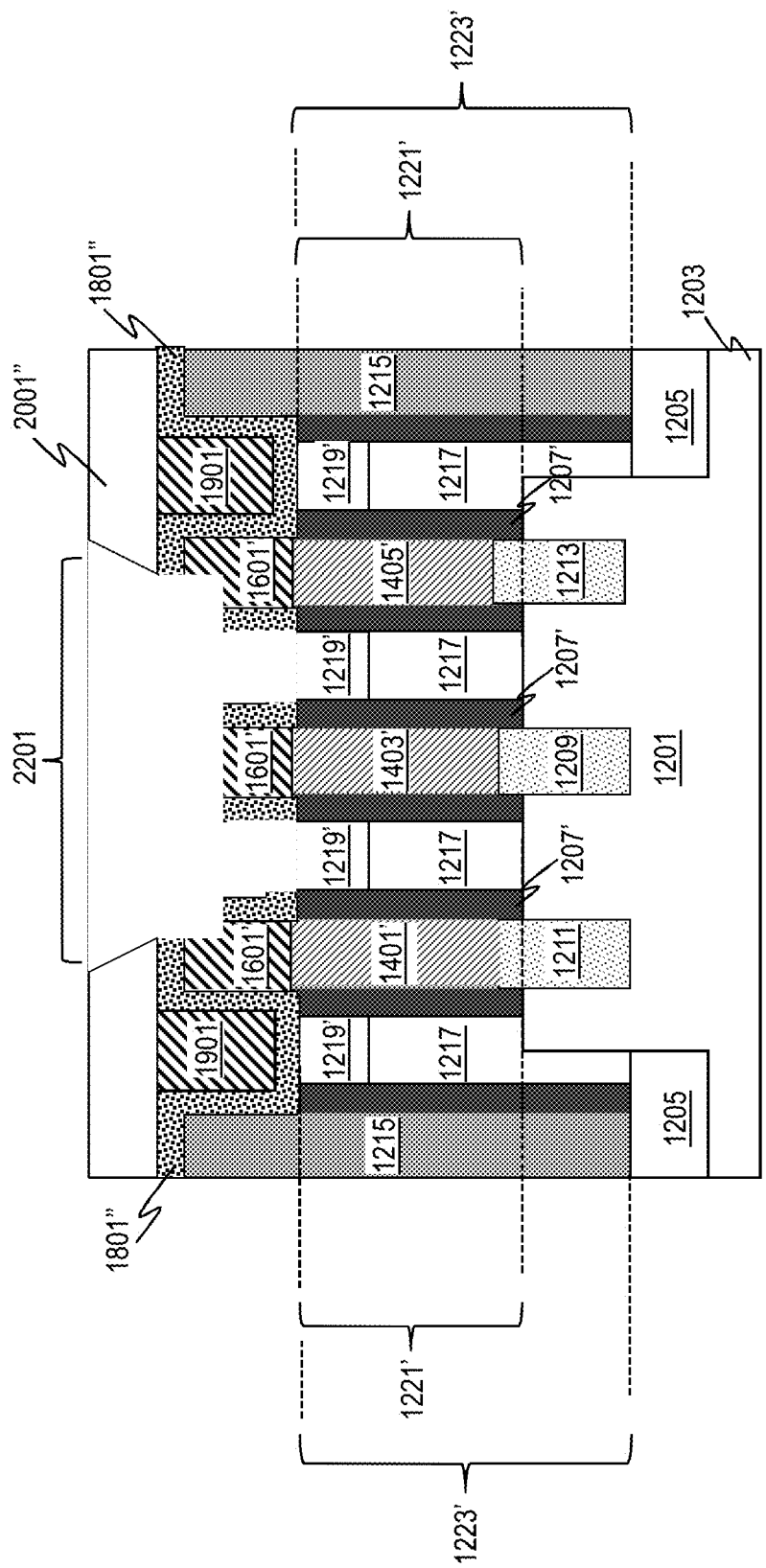
Figure 24:
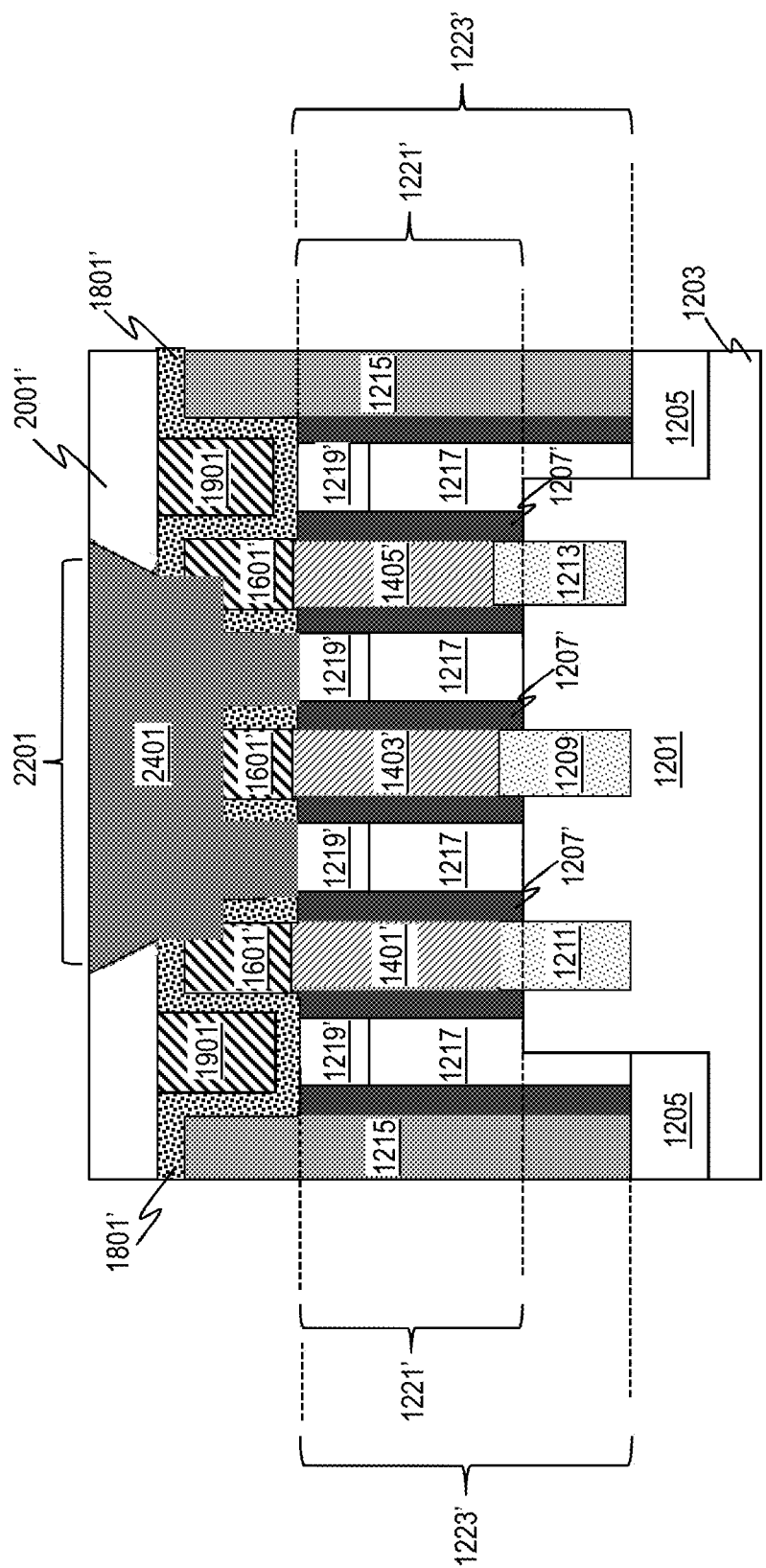

Referring to FIG. 22, a second portion of the ILD layer 2001' is etched, forming ILD layer 2001". Then, the cap layer 1901 over the gate structures 1221 is removed. This is followed by removal of a second portion of the metal oxide layer 1801' and the cap layer 1601, forming metal oxide layer 1801", cap layer 1601' and trench 2201. Subsequently, the trench 2201 is filled with metal layer 2401, e.g., Co, W or Ru, forming a CB to gate structures 1221', as depicted in FIG. 24. The upper surface of the metal layer 2401 is coplanar to the upper surface of the ILD layer 2001'.

The embodiments of the present disclosure can achieve several technical effects, such as robust integration scheme to make contact over active gates, improved density, higher yield and improved device performance. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming first gate structures over a fin of a substrate and second gate structures, each over an outer portion of the fin and a shallow trench isolation (STI) layer adjacent to the fin;
   forming a first raised source/drain (RSD) in a portion of the fin between the first gate structures and a second RSD in the portion of the fin between the first gate structures and the second gate structures;
   forming trench silicide (TS) structures over the first RSD and each of the second RSD;
   forming a first cap layer over the first gate structures and the second gate structures or over the TS structures;
   conformally forming a metal oxide liner over the substrate, a plurality of trenches formed;
   filling the plurality of trenches with a second cap layer;
   forming an interlayer dielectric (ILD) layer over the substrate;
   forming a source/drain contact (CA) through a first portion of the ILD layer and the metal oxide layer down to the TS structures over the second RSD; and
   forming a gate contact (CB) through a second portion of the ILD layer and the metal oxide layer down to the first gate structures.

2. The method according to claim 1, wherein the first gate structures and the second gate structures are formed by:
   forming first dummy gates, laterally separated, over the fin of the substrate and second dummy gates, laterally separated, each over the outer portion of the fin and the STI layer adjacent to the fin;
   forming a sidewall spacer on each sidewall of the first dummy gates and the second dummy gates;
   forming a second ILD layer over the substrate subsequent to the forming of the first RSD and the second RSD;
   planarizing the second ILD layer down to the sidewall spacers;
   removing the first dummy gates and the second dummy gates;
   forming a high-k/metal gate (HKMG) layer between the sidewall spacers and along a portion of the sidewall spacers; and
   forming a metal layer over the HKMG layer between the sidewall spacers and along a second portion of the sidewall spacers or along a remaining portion of the sidewall spacers.

3. The method according to claim 2, wherein the TS structures are formed by:
   removing the second ILD layer between the sidewall spacers over the first RSD and the second RSD, first trenches and second trenches formed, respectively;
   filling the first trench and the second trenches with cobalt (Co), tungsten (W), or ruthenium (Ru); and
   planarizing the Co, W, or Ru down to the sidewall spacers.

4. The method according to claim 2, wherein the metal layer is formed along the second portion of the sidewall spacers, the method comprising:
   forming the first cap layer over the substrate; and
   planarizing the first cap layer down to the sidewall spacers.

5. The method according to claim 4, further comprising recessing the TS structures and adjacent sidewall spacers prior to forming the metal oxide layer.

6. The method according to claim 4, further comprising:
   forming the CA through the second cap layer over the second RSD; and
   forming the CB through the first cap layer over the first gate structures and the second cap layer between the first gate structures.

7. The method according to claim 2, wherein the metal layer is formed along a remaining portion of the sidewall spacers, the method comprising:
   recessing the TS structures;
   forming the first cap layer over the substrate; and
   planarizing the first cap layer down to the metal layer.

8. The method according to claim 4, further comprising recessing the metal layer and adjacent sidewall spacers prior to forming the metal oxide layer.

9. The method according to claim 4, further comprising:
   forming the CA through the first cap layer over the second RSD; and
   forming the CB through the second cap layer over the first gate structures.

10. The method according to claim 1, wherein the metal oxide liner comprises aluminum oxide ($Al_2O_3$), titanium dioxide ($TiO_2$) or hafnium oxide ($HfO_2$) by atomic layer deposition (ALD).

11. A device comprising:
   first gate structures over a fin of a substrate and second gate structures, each over an outer portion of the fin and a shallow trench isolation (STI) layer adjacent to the fin;
   a first raised source/drain (RSD) in a portion of the fin between the first gate structures and a second RSD in the portion of the fin between the first gate structures and the second gate structures;
   trench silicide (TS) structures over the first RSD and each of the second RSD;
   a first cap layer over the first gate structures and the second gate structures or over the TS structures;
   a metal oxide liner over the substrate, a plurality of trenches formed;
   the plurality of trenches filled with a second cap layer;
   an interlayer dielectric (ILD) layer over the substrate;
   a source/drain contact (CA) through a first portion of the ILD layer and the metal oxide layer down to the TS structures over the second RSD; and
   a gate contact (CB) through a second portion of the ILD layer and the metal oxide layer down to the first gate structures.

12. The device according to claim 11, wherein the first gate structures and the second gate structures comprises:
   a high-k/metal gate (HKMG) layer between sidewall spacers and along a portion of the sidewall spacers; and
   a metal layer over the HKMG layer between the sidewall spacers and along a second portion of the sidewall spacers or along a remaining portion of the sidewall spacers.

13. The device according to claim 11, further comprising:
   the CA through the second cap layer over the second RSD; and
   the CB through the first cap layer over the first gate structures and the second cap layer between the first gate structures.

14. The device according to claim 11, further comprising:
   the CA through the first cap layer over the second RSD; and
   the CB through the second cap layer over the first gate structures.

15. The device according to claim 11, wherein the TS structures comprise cobalt (Co), tungsten (W), or ruthenium (Ru).

16. The device according to claim 11, wherein the TS structures are formed to a thickness of 50 nanometer (nm) to 200 nm.

17. The device according to claim 10, wherein the metal oxide liner is formed to a thickness of 2 nm to 10 nm.

18. A method comprising:
   forming first gate structures over a fin of a substrate and second gate structures, each over an outer portion of the fin and a shallow trench isolation (STI) layer adjacent to the fin;
   forming a first raised source/drain (RSD) in a portion of the fin between the first gate structures and a second RSD in the portion of the fin between the first gate structures and the second gate structures;
   forming trench silicide (TS) structures of cobalt (Co), tungsten (W), or ruthenium (Ru) over the first RSD and each of the second RSD;
   forming a first cap layer of silicon nitride (SiN), silicon carbonitride (SiCN), silicon oxycarbonitride (SiOCN) or SiOC over the first gate structures and the second gate structures or over the TS structures;
   conformally forming a metal oxide liner of aluminum oxide ($Al_2O_3$), titanium dioxide ($TiO_2$) or hafnium oxide ($HfO_2$) by atomic layer deposition (ALD) over the substrate, a plurality of trenches formed;
   filling the plurality of trenches with a second cap layer comprising $SiO_2$, SiOC or SiN;
   forming an interlayer dielectric (ILD) layer of silicon dioxide ($SiO_2$), silicon oxycarbide (SiOC) or SiN over the substrate;
   forming a source/drain contact (CA) through a first portion of the ILD layer and the metal oxide layer down to the TS structures over the second RSD; and
   forming a gate contact (CB) through a second portion of the ILD layer and the metal oxide layer down to the first gate structures.

19. The method according to claim 18, wherein the first gate structures and the second gate structures are formed by:
   forming first dummy gates, laterally separated, over the fin of the substrate and second dummy gates, laterally separated, each over the outer portion of the fin and the STI layer adjacent to the fin;
   forming a sidewall spacer on each sidewall of the first dummy gates and the second dummy gates;
   forming a second ILD layer over the substrate subsequent to the forming of the first RSD and the second RSD;
   planarizing the second ILD layer down to the sidewall spacers;
   removing the first dummy gates and the second dummy gates;
   forming a high-k/metal gate (HKMG) layer between the sidewall spacers and along a portion of the sidewall spacers; and
   forming a metal layer over the HKMG layer between the sidewall spacers and along a second portion of the sidewall spacers or along a remaining portion of the sidewall spacers.

20. The method according to claim 18, wherein the TS structures are formed by:
   removing the second ILD layer between the sidewall spacers over the first RSD and the second RSD, first trenches and second trenches formed, respectively;
   filling the first trench and the second trenches with cobalt (Co), tungsten (W), or ruthenium (Ru); and
   planarizing the Co, W, or Ru down to the sidewall spacers.

* * * * *